United States Patent [19]

Johnson

[11] Patent Number: 5,652,445
[45] Date of Patent: Jul. 29, 1997

[54] HYBRID HALL EFFECT DEVICE AND METHOD OF OPERATION

[76] Inventor: Mark B. Johnson, 7742 Jewelweed Ct., Springfield, Va. 22152

[21] Appl. No.: 643,805

[22] Filed: May 6, 1996

Related U.S. Application Data

[63] Continuation-in-part of Ser. No. 425,884, Apr. 21, 1995, and Ser. No. 493,815, Jun. 22, 1995, Pat. No. 5,565,695.

[51] Int. Cl.$^6$ ............................ H01L 29/82; H01L 43/00
[52] U.S. Cl. ..................... 257/295; 257/421; 257/422; 257/426; 257/427; 360/112; 360/113; 324/240; 324/251; 324/252; 365/97; 365/145; 365/170; 365/171
[58] Field of Search ............................ 257/421, 295, 257/422, 424, 425, 426, 427; 360/112, 113; 324/249, 251, 252; 365/97, 145, 170, 171, 182

[56] References Cited

U.S. PATENT DOCUMENTS

| | | | |
|---|---|---|---|
| 4,607,271 | 8/1986 | Popovic et al. | 357/27 |
| 5,237,529 | 8/1993 | Spitzer | 365/158 |
| 5,239,504 | 8/1993 | Brady et al. | 365/157 |
| 5,251,170 | 10/1993 | Daughton et al. | 365/158 |
| 5,420,819 | 5/1995 | Pohm | 365/158 |
| 5,424,236 | 6/1995 | Daughton et al. | 437/52 |
| 5,432,373 | 7/1995 | Johnson | 257/421 |
| 5,452,163 | 9/1995 | Coffey et al. | 360/113 |
| 5,475,277 | 12/1995 | Johnson | 310/156 |
| 5,491,338 | 2/1996 | Spitzer | 250/307 |

OTHER PUBLICATIONS

James Daughton, "Magnetoresistive Memory Technology", Thin Solid Films, vol. 216, 162 (1992).
R. Meservey, P.M. Tedrow and P. Fulde, Phys. Rev. Lett. 25, 1270 (1970).
P.M. Tedrow and R. Meservey, Phys. Rev. Lett. 26, 192 (1971).
P.M. Tedrow and R. Meservey Phys. Rev. B 7, 318 (1973).
Mark Johnson and R. H. Silsbee, Phys. Rev. Lett. 55, 1790 (1985).
Mark Johnson and R. H. Silsbee Phys. Rev. B 35, 4959 (1987).

(List continued on next page.)

*Primary Examiner*—William Mintel
*Attorney, Agent, or Firm*—Law+

[57] ABSTRACT

A modified Hall Effect device can be used as a memory element for the nonvolatile storage of digital information. The novel device includes a ferromagnetic layer that covers a portion of a Hall plate and is electrically isolated from the Hall plate. The ferromagnetic layer on the Hall plate can be changed by an externally applied field, and permits the device to have two stable magnetization states (positive and negative) along an anisotropy axis, which can correspond to two different data values (0 or 1) when the device is used as a memory element. In another embodiment of the invention, the Hall plate is integrated with a conduction channel of a FET, and the ferromagnetic layer is incorporated in proximity to, or as part of the gate over the conducting channel. This device can be described as a "ferromagnetic gated FET." The resulting device also can be fabricated to be magnetically anisotropic so as to permit the device to have two stable magnetization states (positive and negative along the anisotropy axis) which again can correspond to two different data values (0 or 1) when the device is used as a memory element. Both of the above devices can be used as magnetic field sensors, (e.g. as a read head) or in memory arrays where they can operate as non-volatile memory. The modified Hall Plate and ferromagnetic gated FET devices can also be used a logic gate that stores the result of a boolean function. A magnetic field generated by the combined current of one or more input data signals is coupled to the device. Depending on the particular function to be implemented, the magnetization of the ferromagnetic layer can be configured to change or retain its orientation based on particular predefined combinations of input data signals.

75 Claims, 13 Drawing Sheets

OTHER PUBLICATIONS

Mark Johnson and R. H. Silsbee, Phys. Rev. B 37, 5312 (1988).

Mark Johnson and R. H. Silsbee, Phys. Rev. B 37, 5326 (1988).

Mark Johnson, "The All Metal Spin Transistor," I.E.E.E. Spectrum Magazine, vol. 31 No. 5 p. 47 (1994).

Mark Johnson, "The Bipolar Spin Switch," Science 260, 320 (1993).

R. S. Popovi'c, "Hall–effect Devices," Sens. Actuators 17, 39 (1989).

J. De Boeck, J. Harbison et al., "Non–volatile Memory Characteristics of Submicrometer Hall Structures Fabricated in Epitaxial Ferromagnetic MnAl Films on GaAs", Electronics Letters 29, 421 (1993).

Paul Horowitz, and Winfield Hill, "The Art of Electronics," Cambridge Univ. Press, Cambridge U.K. (1980); see p. 328.

HYBRID HALL EFFECT DEVICE AND METHOD OF OPERATION

The present application is a continuation in part of Ser. No. 08/425884, filed Apr. 21, 1995, and Ser. No. 08/493,815 filed Jun. 22, 1995, now U.S. Pat. No. 5,565,695. The present application is also related to a further application by the applicant filed concurrently herewith titled "Magnetic Spin Injected Field Effect Transistor And Method Of Operation".

FIELD OF THE INVENTION

The invention relates generally to a modified Hall Effect device. In particular, the modified device is a hybrid combination of a conventional Hall plate coupled to a ferromagnetic layer. The modified Hall Effect device can be used as a memory element, a magnetic field sensor, or a logic gate, and can also be integrated with a conventional semiconductor field effect transistor (FET), resulting in a hybrid ferromagnetic/semiconductor device. These ferromagnetic elements contribute new parameters to these devices permitting new applications and improved performance in environments such as non-volatile memory storage.

BACKGROUND OF THE INVENTION

The semiconductor Field Effect Transistor (FET), fabricated typically as a metal oxide semiconductor (MOSFET) structure on a silicon substrate or as a Gallium Arsenide (GaAsFET) device on a Gallium Arsenide substrate, is the building block of modern digital electronics. For example, memory cells for the storage of binary information and logic gates for the processing of digital data streams both use FETs as the primary components.

A review of the cell structures of various prior art memory devices follows. Some of these, such as leading volatile memory technology (i.e. memory which is lost when power is not applied, such as in a dynamic random access memory (DRAM)) use conventional semiconductor FET structures and capacitors in their cell designs. A number of alternative memory technologies that are nonvolatile (i.e. memory is retained when power is not applied) use magnetostatic coupling and magnetoresistors comprised of ferromagnetic elements to effectuate a data storage function. In addition, a recent non-volatile device proposed by the present applicant (see U.S. Pat. No. 5,432,373) using a magnetic spin transistor with one or more passive elements is also reviewed.

A brief review of the Hall effect and of Hall effect devices is included. Finally, a short review of the operation of typical logic gates based on conventional FET technology is also provided.

Cell Structures Used In Conventional Volatile Memory Devices

In the case of memory cells used in DRAMs, the most common commercial cell consists of only two elements, a capacitor for data storage and a field effect transistor (FET) for isolation from the array. This cell is popular because the cell size can be made small, resulting in a high packing density and a relatively low production cost. The storage element is a capacitor, and the two stable states representing the binary data "1" or "0" can be, for example, the states with stored charge Q or with stored charge 0. Every cell is connected to an array of write and read wires, also called "bit" and "word" lines. Since one capacitor linked together with other capacitors in an array will lose its charge to its neighbor, the capacitor of each cell is connected to a transistor within that cell so as to be isolated from the array. When the transistor is "on" there is a low resistance to a write or read wire so that an applied voltage can charge the capacitor during a write process or a sense circuit can determine the stored charge during a read process. When the transistor is "off," a high impedance to the write or read wire isolates the capacitor electrically from any other element in the array.

Typically, a Metal Oxide Semiconductor Field Effect Transistor (MOSFET) for use in a DRAM is fabricated by standard lithographic processing techniques on a silicon substrate. The oxide that isolates the gate from the channel is highly insulating, so that the metallized gate has a capacitance to the rest of the device. In some designs the gate capacitance is used as the storage capacitance. Reading is performed with a sense circuit that compares the charge (or voltage) of C with the charge (or voltage) of a standard capacitor C" in a dummy cell. Readout voltages are the order of 10 to 100 mV and the stored charge Q is the order of a million electrons.

The conventional DRAM memory device, however, suffers from a number of operational and physical drawbacks. For one, the memory is volatile. Unavoidable leakage currents discharge the capacitor so that each cell must be refreshed constantly, i.e. read and rewritten, approximately every few milliseconds. Furthermore, background alpha-particle radiation can induce sufficient conductance in the MOSFET to drain the capacitor spuriously, erasing the memory of that cell.

Finally, cell dimensions are not shrinking to the limit permitted by lithography because of restrictions on the capacitor size. Consequently, there are limits on how dense these devices can be made using conventional techniques.

Cell Structures Used In Alternative Non-Volatile Memory Devices

Several alternative technologies can be used to make nonvolatile memory cells. Capacitive memory elements utilizing ferroelectric material as a dielectric have undergone decades of development work, but still suffer from fatigue: they cannot provide an infinite number of read/write cycles.

Several competing approaches use ferromagnetic materials. Three such technologies are reviewed below.

Magnetoresistive Random Access Memory (MRAM)

Magnetoresistive Random Access Memory was proposed a decade ago [J. M. Daughton, "Magnetoresistive Memory Technology," Thin Solid Films 216, 162 (1992)] This device employs an array of bit and word lines. Each bit line is divided into n storage cells. Each cell is a trilayer composed of a ferromagnetic metal base layer, a nonmagnetic metal middle layer, and a ferromagnetic metal top layer. Note that the F-N-F geometry is not the same as giant magnetoresistance (GMR) structures; the layers are so thick that interfacial spin scattering at the F-N interfaces is a negligible fraction of all scattering events, and there is no exchange coupling across the N layer. The cell has length l, width w and thickness d. Looking at a cell in cross section across the width, there are two stable magnetization states determined by magnetostatic coupling, each with the magnetization of the two ferromagnetic films oriented in opposing directions: clockwise and counterclockwise.

The resistance of each cell, measured with a sense current applied along the length of the cell, is a function of the anisotropic magnetoresistance (AMR) of the F layers. It has value $R_1$ when the magnetizations are perpendicular to the sense current (as is the case for either stable magnetization state) and $R_1'$ if the magnetizations of the ferromagnetic layers are forced to lie parallel to the sense current. Each cell in the bit line is connected to the next cell with a conducting strip which has resistance $R_c$.

Columns of n word lines cross the m rows of bit lines. Each nonmagnetic word line crosses the top of a cell in each bit line. The state of cell (i,j) is written by sending current pulses of appropriate amplitude through bit line i and word line j, using the magnetic fields from the currents to cause the magnetization of the cell to orient either clockwise or counterclockwise. The contents of the cell are read by first biasing word line j with a large enough current so that fields from the current cause the magnetizations of both ferromagnetic layers to be canted to an orientation that is approximately 45 degrees away from the axis of the bit line.

In this orientation the resistance of the cell (for a sense current applied along the bit line) has a value $R_2$ that is between $R_1$ and $R_1'$. Next, a sense current is applied along the bit line, and a voltage is measured across the bit line, having a value proportional to $(n-1)R_1+R_2+nR_c$. Finally, a read current pulse is applied to the word line, in addition to the original bias current. The field from this current pulse changes the magnetization orientation in a direction more nearly parallel to the sense current if the initial orientation was clockwise, or in a direction more nearly perpendicular to the sense current if the initial orientation was counterclockwise. Thus, the voltage across the bit line either increases or decreases when the read pulse is applied. A sense circuit that measures changes of voltage records the positive or negative change as a "1" or a "0".

By using a derivative sense technique, MRAM avoids the necessity of electrically isolating each cell. However, this approach for a non-volatile memory element also suffers from a number of drawbacks.

To begin with, the readout voltage is quite small and the signal to noise ratio is poor. The change in resistance that must be sensed during the read process is a small fraction of $R_1$, and this small change must be distinguished from a backgound of approximately $nR_1+R_c$. In practice, two elements are fabricated for each cell, thus doubling the signal, and the read process is repeated several times so that the final readout is taken as an average of repeated samplings, thus lowering the noise. This increases the time for a read cycle. Power dissipation is relatively large during readout because relatively large currents must be applied to long, resistive lines. Finally, errors can be introduced during readout if the bias current tips the magnetization into an unstable state.

MRAM with GMR Elements

Another conventional approach uses a magnetoresistor R as the storage element, and the cell is comprised of R, a reference resistor R', and two or three FETs to isolate the cell from the rest of the array. The magnetoresistor R is typically a thin film ferromagnetic metal (or ferromagnetic/ nonmagnetic metal multilayer) resistor with length l, width w and thickness d, and has two values, R' and R'+δR, corresponding to two stable magnetization states.

For example, in one state the magnetization of a permalloy film might be parallel to the direction of flow of the sense current, $I_{sense}$, and in the other state the magnetization might be perpendicular to $I_{sense}$. For GMR elements, one state corresponds to the magnetizations ^M1 and ^M2 of F1 and F2 aligned parallel (or the magnetizations $M_i$ of all ferromagnetic layers in a multilayer stack aligned parallel), and in the other state ^M1 and ^M2 are antiparallel (or the alternate ferromagnetic layers of the multilayer stack are antiparallel)." The magnetization state is written by using the magnetic field generated by current pulses applied to an array of write lines.

The read process begins by selecting a cell. When a cell is addressed the isolating FETs are set to the "on" state by driving the appropriate word line to a high voltage. In this state the FETs conduct current with some low resistance, the order of 1000 Ω or less. A bias current $I_{sense}$ is then applied to both the magnetoresistor R and the reference resistor R'. A sense circuit at the end of a line of cells compares the two voltages and interprets a "1" or "0" when, for example, $I_{sense}*(R-R')>0$ or $I_{sense}*(R-R')=0$ respectively. The voltage levels corresponding to "1" (or "0") are then amplified to TTL or CMOS levels.

The voltage $I_{sense}*\delta R$ that distinguishes a "1" from a "0" must be large enough for reliable discrimination. Since the magnetoresistive ratio δR/R' of ferromagnetic films (or GMR multilayers) is small, 10 percent or less, the magnetoresistor must be made quite large. For example, with R=100 Ω and δR/R'=0.06, a reasonable bias current of 1 mA would produce a readout voltage difference of only 6 mV, and a poor signal to noise ratio is a characteristic of GMR cells.

The approach has several other drawbacks. A resistor occupies substantial area in a cell. Continuing the above example, the 100 Ω magnetoresistor could be fabricated using ferromagnetic materials with resistivities of about 20 μΩ-cm, with a length l=5 μm, width w=1 μm, and thickness d=0.01 μm. In addition, this cell requires the fabrication of two resistors, R and R', thus requiring additional isolation FETs and, all together, taking up considerable space. The reference resistor cannot be placed outside the cell because the resistive difference, δR, is so small that the resistance of each memory resistor must be matched to a particular reference. Since resistance is a function of temperature, R=R(T), the reference resistor must be fabricated very near the magnetoresistor so that both resistors will always be at the same temperature, and the material for the reference resistor must be carefully chosen so that the temperature dependence of its resistivity is similar to that of the magnetoresistor. Finally, the resistance of each cell is quite large. When numerous cells are placed on a single read line, as in an array, the resistance of the read line is substantial. Since the read process uses current bias, the power dissipated in each read cycle is relatively large.

Spin Transistor Nonvolatile RAM (NRAM)

Active devices using magnetic spin transport are well known in the art. The history of spin transport begins with an experiment by Meservey [R. Meservey, P. M. Tedrow and P. Fulde, Phys. Rev. Lett. 25, 1270 (1970); P. M. Tedrow and R. Meservey, Phys. Rev. Lett. 26, 192 (1971); Phys. Rev. B 7, 318 (1973)] where it was shown that the electric current tunneling from a ferromagnetic electrode across a low transmission barrier into a superconducting detector carried a net spin polarization. A later spin injection experiment [described in several journals, including Mark Johnson and R. H. Silsbee, Phys. Rev. Lett. 55, 1790 (1985); Phys. Rev. B 35, 4959 (1987); Phys. Rev. B 37, 5312 (1988); Phys. Rev. B 35, 5326 (1988)] then demonstrated that (i) current driven across any ferromagnet—nonferromagnet (F1-N) interface carried a net spin polarization, (ii) that a nonequilibrium population of spin polarized electrons, equivalently a nonequilibrium magnetization ~M, diffused away from the F1-N interface into N with a characteristic length equal to the classic spin diffusion length $\delta_s$, and (iii) that the nonequilibrium magnetization in N affected the current flow (or the voltage developed) at the N-F2 interface of a second ferromagnetic film.

A replacement for conventional semiconductor devices was proposed by the present applicant in connection with a device known as the bipolar spin transistor. This device and related modifications is described in Mark Johnson, "The All Metal Spin Transistor," I.E.E.E. Spectrum Magazine, Vol. 31 No. 5 p. 47 (1994); and Mark Johnson, "The Bipolar Spin Transistor," Science 260, 320 (1993). This device is generally depicted schematically in FIG. 1, with F1 150 and F2 152 arranged on one side of a bulk sample of aluminum 154. F1 150 injects a source of diffusing spin polarized electrons 156 and F2 152 detects their presence. This device is a novel F-N-F structure that can be used as a circuit element in a nonvolatile memory cell and has several advantages. Since the readout voltage is bipolar, positive for ^M1 and ^M2 parallel and negative for ^M1 and ^M2 antiparallel, the discrimination between a logical "1" and "0" is relatively easy; each cell needs only a single storage element whose readout is compared with ground. Furthermore, the transimpedance of the spin transistor scales inversely with size, so the readout voltage is larger (for constant current) for smaller devices, thus promoting the shrinking of cell size.

Two characteristics of the device must be taken into consideration when using the device in NRAM. First, the device can be fabricated entirely from metals, and is therefore characterized by a low electrical impedance. Thus, to fabricate an array of such elements it is necessary to electrically isolate each element from others in the array, so that the output of any element will not be shorted to ground through a neighboring element. Second, the output voltages available from the device are less than TTL or CMOS levels, and the output must therefore be amplified before it is incorporated in TTL or CMOS circuits.

Another spin transistor NRAM cell design [Mark Johnson, "Magnetic Spin Transistor," U.S. Pat. No. 5,432,373, issued Jul. 11, 1995] is composed of a spin transistor and one or more capacitors and resistors. The passive elements provide isolation for the spin transistor of each cell, and the readout voltage was transmitted to the end of a line of elements for amplification. A drawback of this design is that resistors and capacitors take up substantial space on a chip. Thus, a substantial portion (even a majority) of cell area is occupied by passive elements, packing densities are limited, and the unique scaling feature of the spin transistor is wasted.

Furthermore, cell isolation is not very efficient and the readout voltage can be degraded during transmission to the sense circuit, resulting in higher noise and lower readout sensitivity. More recent proposals for spin transistor memory cell designs [see applicationsreferenced above] incorporate a spin transistor with one (or more) isolating FETs. This is a practical approach, and can achieve packing densities comparable with, or higher than, DRAM.

However, until the present invention it has been impossible to integrate the functions of nonvolatile storage and cell isolation in a single element.

Hall Plate Sensors and Memory Elements

Hall plates have long been used as magnetic field sensors to measure fields that are homogeneous over the area of the plate. There are also numerous devices that combine ferromagnetic films along with Hall plates. In a typical configuration [see R. S. Popovi'c, "Hall-effect Devices," Sens. Actuators 17, 39 (1989)], the Hall plate is embedded, by an appropriate doping technique, vertically (i.e. perpendicular to the substrate surface) in a semiconducting substrate. A ferromagnetic film is fabricated outside the region of the Hall plate, and is used to "focus" the flux of an external magnetic field onto the vertical Hall plate. Loosely speaking, the external field is enhanced by the permeability of the ferromagnetic material.

The disadvantages of this device, which is used as a sensor with linear response, include the fact that the sensitivity of this device is limited and the device is relatively expensive. The sensitivity is limited because the enhancement ratio of the magnetic field at the focus of the ferromagnetic layer relative to the applied field is relatively small. Moreover, the geometry of the device does not permit a memory effect and, in other ways as well, prevents it from being implemented practically as a memory element.

A second configuration, called a "Magnetic Field Sensor," (U.S. Pat. No. 4,607,271; 1986) has been proposed, but has not found application. The preferred embodiment is depicted in FIG. 2, which shows a portion of a magnetotransistor fabricated on a P- doped region of a N-doped silicon substrate. Insulating layers 212 passivate the surface of the silicon, and a ferromagnetic film 220 with in-plane anisotropy (such as NiFe or NiCo) is fabricated on top of an insulating film 212 between the collector 216 and emitter 218. The magnetization of the ferromagnetic film 220 always lies in the plane of the film, and the film is fabricated to have an easy axis of magnetization parallel to the ^y axis so that the magnetization 220 is oriented either along +^y or −^y. The device is situated so that the external field H to be detected is also oriented along ^y. The easy axis of the ferromagnetic film 222 is oriented perpendicular to the direction of current flow, from emitter to collector along ^x. The N+ diffused regions of the collector 216 and emitter 212 extend to a depth of several microns or more (up to 1 mm) from the surface of the substrate, and the P-doped region also has minimum thickness of several microns. Thus, current I flows throughout a cross-sectional area of width w (typically 50 microns) and depth d of order 1 to 10 microns, and this area is known as the "sensitive zone" 224. When a small field H (larger than the coercivity $H_c$ of ferromagnetic film 222) orients the magnetization 220 along +^y, the ferromagnetic film 222 generates a magnetic field B. This is depicted in FIG. 2A, a view taken in cross-section through the middle of the ferromagnetic film. The field B (sketched with field lines 230) is approximately that of a bar magnet. In the vicinity of zone 224 the field is approximately uniform, oriented along ±^y, and deflects the current by Lorentz force in the same way that the external field H deflects the current. The deflected current is detected in a standard way by the characteristics of the magnetotransistor. When the external field H is of opposite sign and exceeds $H_c$, $|H|>|H_c|$, the magnetization reverses orientation, the field B changes sign, the Lorentz deflection changes sign, and the magnetotransistor detects the reversed deflection as a changed output. The field B in zone 224 is approximately 5 to 15 Oe, as much as ten times larger than the coercivity $H_c$ of ferromagnetic film 222. Thus, the "Magnetic Field Sensor" is more sensitive to applied field than a magnetotransistor fabricated without the ferromagnetic film. The device can be analyzed by saying that the ferromagnetic film acts as a field transducer with a gain of (approximately) ten, and that it converts an external field H along ^y to a field B that is also along ^y. It is also important to note that the ferromagnetic film 220 must be fabricated centered between the emitter and collector and centered over the "sensitive zone" 224, and the easy axis must be perpendicular to the direction of current flow.

Whereas this device has the advantage that the field B is approximately uniform throughout the "sensitive zone," the chief disadvantage is that the gain is low. The magnitude of B is only a few times larger than that of the coercivity $H_c$, so that the maximum gain is about ten, and the signal to noise ratio suffers. Furthermore, the uniformity of B is achieved by making the ferromagnetic film relatively long. In other words, the device is not scalable; as it is made smaller the performance degrades. Such behaviour is the opposite of what is desired for microfabricated, high density elements, and renders the device too large to be used practically as a memory cell. It is apparent that it is desirable to invent a novel, hybrid ferromagnetic-semiconductor Hall device that is scalable (i.e. device characteristics do not degrade as the dimensions are shrunk) and that has much higher gain, and therefore much higher signal to noise ratio.

Another combination of a Hall conductor, gallium arsenide, and a ferromagnetic film has been devised as a memory cell [J. De Boeck, J. Harbison et al., "Non-volatile Memory Characteristics of Submicrometer Hall Structures Fabricated in Epitaxial Ferromagnetic MnAl Films on GaAs", Electronics Letters 29, 421 (1993)]. Before describing this device it is necessary to review some properties of ferromagnetic materials. Thin ferromagnetic films can be categorized according to their anisotropy energies and fall into two categories: those with magnetization anisotropy that favors the magnetization lying in the film plane and those with anisotropy that favors magnetization oriented perpendicular to the plane. In the device described by Harbison and depicted in FIG. 2B a ferromagnetic material F 552 with magnetization anisotropy perpendicular to the plane, the τ phase of MnAl, is epitaxially grown as a thin film on a buffer layer of AlAs 554 that in turn is grown on a gallium arsenide substrate 556. Ferromagnetic film F 552 has two stable states, with magnetization ^M 558 pointing up or down. The state of F is written by using the stray field from a current pulse in a contiguous write line (not shown). The state is "read" by using a technique called "the extraordinary Hall effect." The extraordinary Hall effect occurs in magnetic materials, arises from a mechanism unrelated to that of the ordinary Hall effect, and results in a voltage that is developed transverse to the bias current (in a manner similar to the classic Hall effect). In the Harbison device sense leads 560 and 562 are attached to MnAl 552, and the Hall effect in the GaAs is not employed. As a result of the extraordinary Hall effect, when ^M 558 is oriented down a positive voltage is developed between S1 and S2. When ^M 558 is oriented up, the generated voltage has the opposite sign.

One disadvantage of the Harbison device is that ferromagnetic materials with large anisotropies perpendicular to the plane also have large coercivities. Therefore, large magnetic fields (and large write currents) are required to write the device state. A second disadvantage is that these materials are typically exotic (uncommon) and must be grown epitaxially, which is an expensive process..Third, the magnitude of the extraordinary Hall effect is somewhat smaller than the ordinary Hall effect in materials with high Hall mobilities, so the signal to noise ratio is relatively poor.

FET Logic Gates

Logic operations in computing devices are typically performed with digital voltage pulses and FET gates that are linked together in an appropriate way. To provide an example that permits a brief critical discussion, a standard arrangement [Paul Horowitz and Winfield Hill, "The Art of Electronics," Cambridge Univ. Press, Cambridge U.K. (1980); see p. 328] for an AND gate operation is depicted in FIG. 3 where each element $Q_i$ is an enhancement mode FET. $Q_1$ 10, $Q_2$ 12 and $Q_5$ 18 are p-channel FETs. A p-channel FET has a high impedance, and is therefore in the "off" state, when the gate voltage is zero or positive. It has a low impedance, and is therefore in the "on" state, when the gate voltage is lower than a threshold value below zero (where the threshold value is typically 0.5 Volt or less). $Q_3$ 14, $Q_4$ 16 and $Q_6$ 20 are n-channel FETs. An n-channel FET is "off" when the gate voltage is below ground and "on" when the gate voltage is larger than a threshold value above ground. Voltage pulses of positive or zero amplitude (HIGH or "1"; or LOW or "0") are applied simultaneously to the inputs A 22 and B 24, and the cell operates as an AND gate in the following way.

When inputs A 22 and B 24 are HIGH ("1"+"1"), $Q_3$ 14 and $Q_4$ 16 are "on", $Q_1$ 10 and $Q_2$ 12 are "off", and consequently the voltage at node 26 is LOW, i.e. at ground. Since $Q_6$ 20 is "off" and $Q_5$ 18 is "on" the voltage output (OUT) 28 is HIGH "1"). When A 22 and B 24 are LOW ("0"+"0"), $Q_3$ 14 and $Q_4$ 16 are "off", $Q_1$ 10 and $Q_2$ 12 are "on", and consequently the voltage at node 26 is HIGH. Since $Q_5$ 18 is "off" and $Q_6$ 20 is "on" the voltage output (OUT) 28 is LOW, at ground ("0"). When A 22 (or B 24) is HIGH and B 24 (or A 22) is LOW ("1"+"0"), $Q_3$ 14 and $Q_2$ 12 are "on", $Q_1$ 10 and $Q_4$ 16 are "off", and consequently the voltage at node 26 is HIGH and the voltage output (OUT) 28 is LOW, at ground ("0"). The truth table 30 for the above operations is seen to be the same as that of an AND gate.

Although logic gates of this design are the backbone of digital electronic processing, they suffer from several disadvantages. It requires numerous FETs (six in the example of FIG. 1) to comprise the logic gate cell, and therefore the cell occupies a large area of the chip. Furthermore, the result of the Boolean process is not stored and must be synchronized with a clock cycle to be used in the next operating step, or must be sent to a separate storage cell for later recall. The above discussion was presented for complimentary metal oxide silicon (CMOS) logic devices. The transistor-transistor logic (TTL) family is based on bipolar transistors, but similar conclusions apply. In other words, the cell of a single TTL logic gate is comprised of several transistors and several resistors, and uses considerable space on a chip. It is apparent that it would be desirable to integrate the functions of logic operation and storage in a single element.

SUMMARY OF THE INVENTION

Accordingly, there is a significant need for improved devices that can be used easily and reliably in high density memory and logic environments.

An object of the present invention therefore is to provide an improved Hall Effect device that includes ferromagnetic components and that can be used as a memory element for the nonvolatile storage of digital information, as well as in all other environments (including, for example, logic applications for performing digital combinational tasks, and a magnetic field sensor).

Another object of the present invention is to provide an improved hybrid FET device that combines the modified Hall Effect device of the present invention with a conventional semiconductor FET structure, and which also can be used as a replacement for traditional FETs (or traditional field sensors) in the above mentioned applications.

According to a first embodiment of the present invention, a novel Hall effect device is fabricated using a ferromagnetic layer that covers a portion of the Hall plate and is electrically isolated from the Hall plate. This structure can be referred to generally as a "modified Hall plate."

The ferromagnetic layer of the modified Hall plate can be fabricated to be magnetically anisotropic so as to permit the device to have two stable magnetization states (positive and negative along an anisotropy axis). Thus, the modified Hall plate has two stable Hall voltage states determined by the orientation of the magnetization of the ferromagnetic layer: "positive" Hall voltage (for positive orientation) and "negative" Hall voltage (for negative orientation). An external magnetic field can be used to change the magnetization state of the device by orienting the magnetization of the ferromagnetic layer to be positive or negative.

According to a second embodiment of the present invention, a conduction channel of a FET can act as a Hall Plate and a ferromagnetic material can be incorporated in proximity to, or as part of, the gate over the conducting channel. This device can be described as a "ferromagnetic gated FET." When the ferromagnetic film is fabricated as a portion of the gate of an FET, the resulting ferromagnetic gated FET has two stable states determined by the gate voltage, "off" and "on". The ferromagnetic layer of the ferromagnetic gated FET can be fabricated to be magnetically anisotropic so as to permit the device to have two stable magnetization states (positive and negative along the anisotropy axis). Thus, in the "on" state the ferromagnetic gated FET has two stable Hall voltage states determined by the orientation of the magnetization of the ferromagnetic layer, "positive" Hall voltage (for positive orientation) and "negative" Hall voltage (for negative orientation). An externally controlled magnetic field can be used to change the magnetization state of the device by orienting the magnetization of the ferromagnetic layer to be positive or negative.

In additional embodiments of the present invention, both the modified Hall Effect device and the ferromagnetic gated FET can operate as a sensor of magnetic field (e.g. as a read head).

In alternative embodiments the modified Hall plate (and the ferromagnetic gated FET) can be provided having a conductive write layer for carrying a write electric current and inductively coupling a write magnetic field associated with this write current to the ferromagnetic film. An external current generator can change the magnetization state of the ferromagnetic layer by inductively coupling a magnetic field to said ferromagnetic layer. Even if power is removed from the above devices, the ferromagnetic layer orientation is retained in its set state, thus causing the modified Hall plate (and the ferromagnetic gated FET) to behave as a nonvolatile memory element, because the two states of the magnetization orientation of said ferromagnetic layer can correspond to data values stored in said memory element.

In further embodiments a number of modified Hall plates (or ferromagnetic gated FETs) are coupled together in an array to form a modified Hall plate (or ferromagnetic gated FET) memory array. The present modified Hall plate (or ferromagnetic gated FET) therefore will find application as the basic storage element in integrated arrays of nonvolatile random access memories (NRAM), and may be used as a replacement for conventional system memory (such as DRAM) and direct access memory (such as magnetic disk drives) in many applications.

The present modified Hall plate invention is a substantial improvement over existing memory cell elements. It is an improvement over DRAM because there is only a single element in the cell. Therefore the cell can be smaller and higher packing densities can be achieved. The memory is nonvolatile; since it does not need refreshing it draws zero quiescent power and therefore uses less energy. Furthermore, it is not susceptible to errors induced by background radiation, i.e. it is radiation hard. It is an improvement over other nonvolatile cells because there is only a single element permitting the cell size to be smaller and permitting increased packing densities. The signal to noise ratio is larger than afforded by magnetoresistive technologies, and fabrication, which can be achieved with conventional semiconducting and ferromagnetic materials, is compatible with standard semiconductor processing and other well known ferromagnetic processing techniques.

The present ferromagnetic gated FET invention is a substantial improvement over existing memory cell elements for the same reasons as the modified Hall plate. Comparing the ferromagnetic gated FET with the modified Hall plate, the former has the additional advantage that each cell is completely isolated from the memory array and the architecture more closely matches that of conventional memories such as DRAM, thus enhancing incorporation with CMOS products. The modified Hall plate has the advantage that it can be fabricated with somewhat smaller dimensions, and can therefore achieve relatively greater packing densities.

In further embodiments of the present invention, a modified Hall plate (or ferromagnetic gated FET) can be used as a logic gate. The following description is written for the ferromagnetic gated FET, but it will be understood by those skilled in the art that similar if not identical arguments apply to the modified Hall plate. This logic gate can implement any desired combinational task (function) relating one or more inputs to said ferromagnetic gated FET to an output of the ferromagnetic gated FET. Depending on the particular function to be implemented, the state of the logic gate (determined by the magnetization state of the ferromagneic layer) is first set using a magnetic field generated by a current pulse transmitted in a write line inductively coupled to the ferromagnetic layer. This same wire also inductively couples a magnetic field generated by the combined current of one or more input data signals to the ferromagnetic gated FET. Again, depending on the particular function to be implemented, the ferromagnetic layer magnetization can be configured to change or retain its orientation depending on the particular combination of input data signals. In other words, the ferromagnetic layer magnetization may be read out as an output binary "1" or "0" corresponding to some Boolean process dependent on the data input signals. In any specific embodiment, therefore, the present invention can be configured to implement the function of any of the following gates: a NOR gate, a NOT gate, a NAND gate, an OR gate and an AND gate, or more generally any logic gate implementing a logical combinational task relating one or more combination of inputs/outputs.

The present ferromagnetic gated FET invention is a substantial improvement over prior semiconductor gates using ordinary semiconductor transistors. There are fewer elements per logic cell, so cell size can be reduced and packing density increased. The result of each data processing step is stored as the state of the device and can be read out at any later time, without synchronization to a clock cycle. In this way, parallel processing is facilitated, and even higher packing densities can be achieved because additional memory cells for storage of the result on any process can be eliminated. Furthermore, although the basic ideas are presented for a two-state device, appropriate for binary processing, it is possible to fabricate a ferromagnetic layer with more than two stable magnetization states. Therefore, more generally an n-state device can be fabricated, and simultaneous processing of n bits is possible.

The present modified Hall plate is a substantial improvement over prior art Hall devices. Compared with vertical Hall plates with ferromagnetic flux focusing, the modified Hall plate is less expensive to fabricate because it is fabricated with a horizontal (rather than vertical) configuration, has higher gain (higher sensitivity to magnetic field), can be microfabricated at smaller dimensions, and has a memory effect such that it can be used as a nonvolatile memory element or as a logic gate. Compared with the prior art "Magnetic Field Sensor" referred to above, the modified Hall plate of the present invention is inversely scalable, i.e. the device characteristics improve as the device is made smaller, whereas the "Magnetic Field Sensor" is not scalable, i.e. its characteristics degrade as it is made smaller. Because of this the prior art "Magnetic Field Sensor" is not suitable for memory or logic applications. Furthermore, the present modified Hall plate has an improved gain, at least 25 times larger than the "Magnetic Field Sensor" of the prior art and is less expensive to fabricate since it requires fewer fabrication steps. Compared with the "Epitaxial MnAl" prior art devices with extraordinary Hall effect readout, the magnetization state of the present modified Hall plate is characterized by a smaller coercivity, so that much smaller values of magnetic field are required to set or reset the device (equivalently, the modified Hall plate, as a memory element, uses smaller bias current and thus has greater gain). Furthermore, the signal to noise ratio is greatly improved.

DETAILED DESCRIPTION OF THE INVENTION

Conventional Hall Effect Devices

Figure 5A:
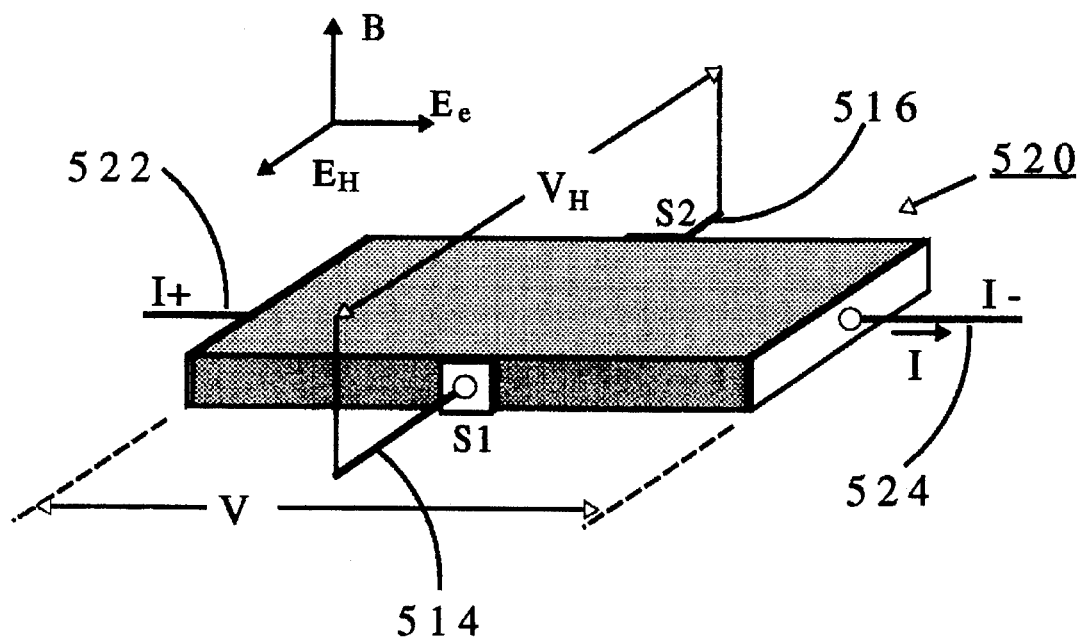
FIGS. 5A and 5B are perspective views of conventional Hall Plates.

A typical Hall effect device is shown in FIG. 5A, where a current I is driven through a thin rectangular plate called a Hall plate 520. When a uniform magnetic field B is applied perpendicular to plate 520, a Lorentz force on current carriers (electrons or holes) in the plate generates an electric field perpendicular to the direction of the B field and to the direction of current flow from terminal 522 to terminal 524. A voltage measurement made between sense contacts (S1 514 and S2 516) on the sides of plate 520 measure a Hall voltage $V_H$ caused by the Hall effect. When the sign of B is reversed the sign of the detected voltage also reverses.

Figure 5B:
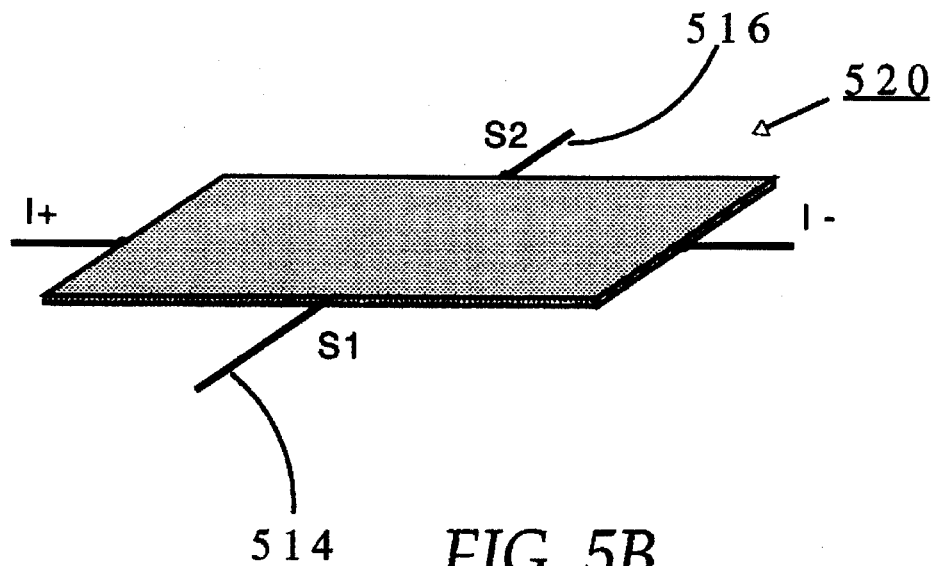

All conductors demonstrate a Hall effect, with the strongest effect in materials with low carrier density such as bismuth (a metal) or properly doped silicon and gallium arsenide (semiconductors). The effect is relatively weak in metals and relatively strong in semiconductors. A quantitative measure of the strength of the effect in a particular material is a property called the Hall mobility $\mu_H$. The thickness of Hall plate 520 does not contribute to the effect and in general thinner plates work better. In particular, a thin bismuth film, a thin film of doped silicon or gallium arsenide, a two dimensional electron gas (2DEG) or the conducting channel of a FET function well as a Hall plate. A typical thin Hall plate is depicted in FIG. 5B.

Modified Hall Plate Embodiment

Figure 1:
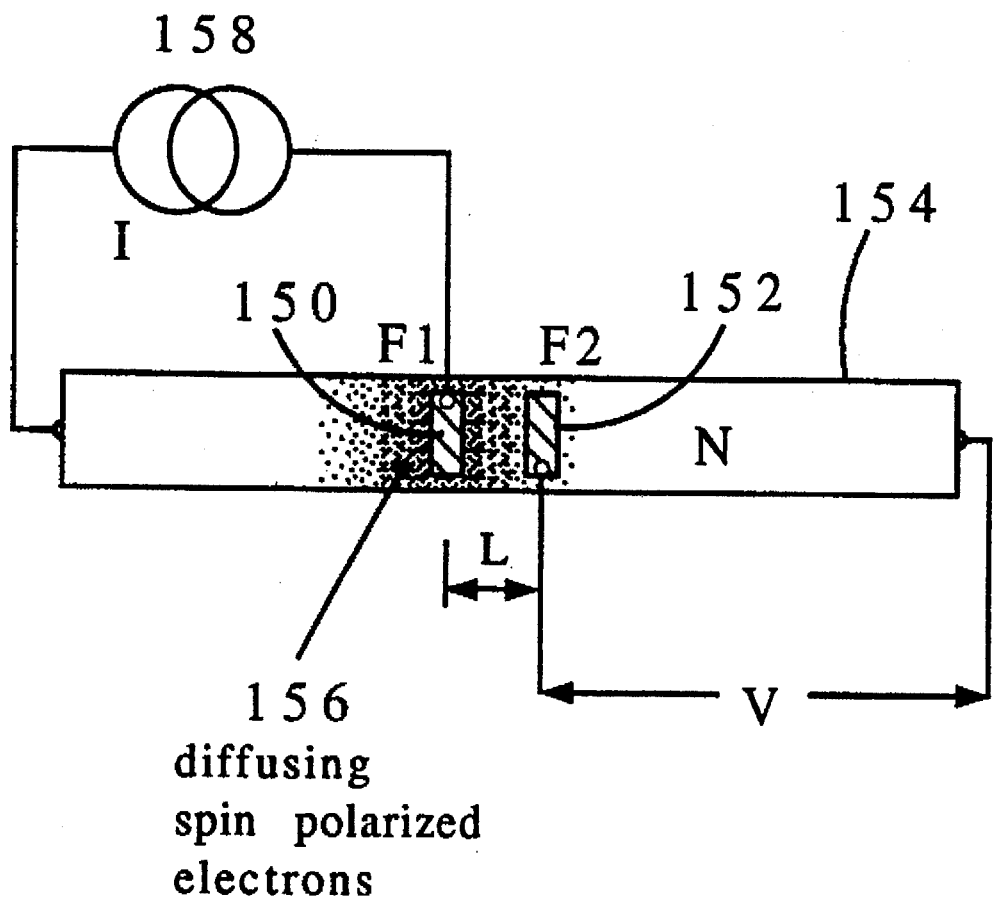
FIG. 1 is a schematic top view of a prior an "spin injection" transistor that uses spin polarized electrons.
Figure 2:
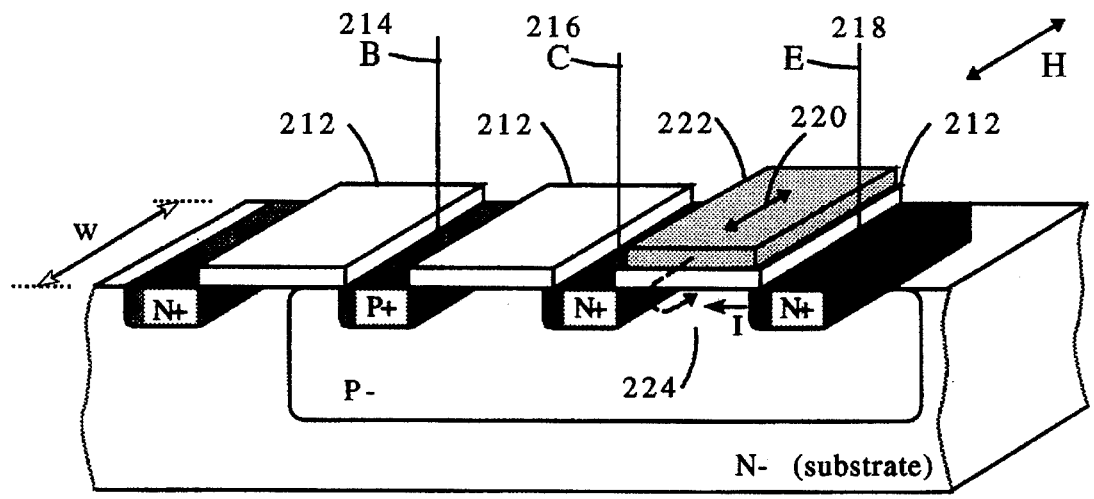
FIG. 2 is a schematic view of a prior art Magnetic Field Sensor using a ferromagnetic film and a magnetotransistor.
Figure 2A:
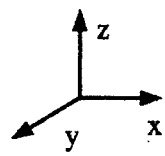
FIG. 2A is a cross-sectional view of the device of FIG. 2 showing the field distribution in the current-carrying region of the magnetotransistor.
Figure 2A:
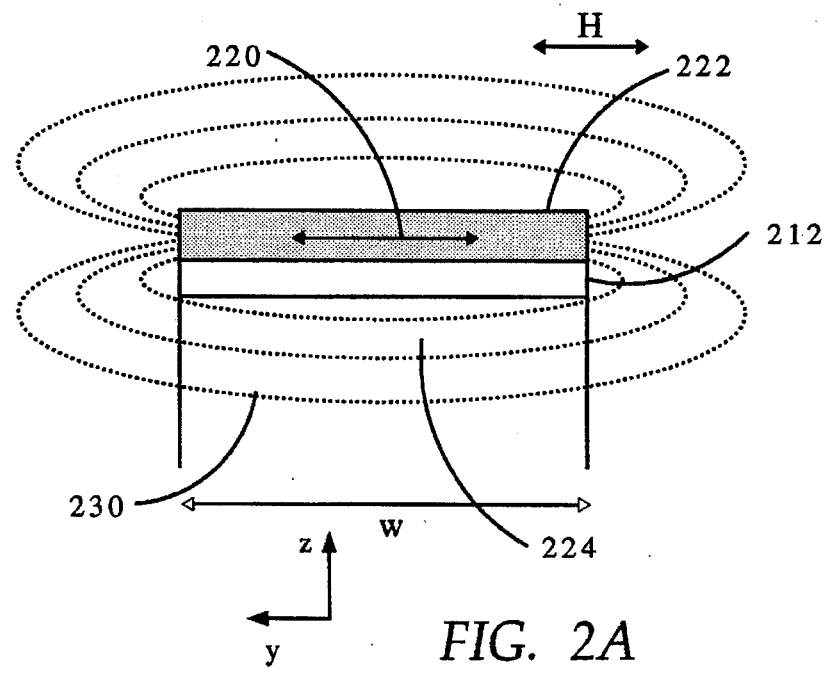
Figure 2B:
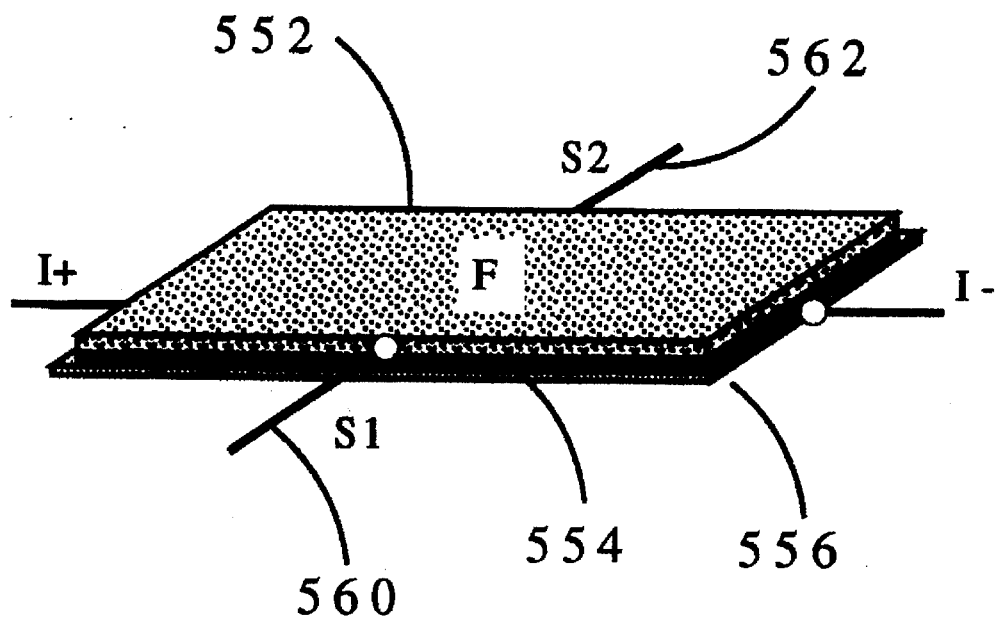
FIG. 2B systematic cross-sectional view of a prior art memory cell that uses a semiconductor substrate and ferromagnetic films having magnetic anisotropies perpendicular to the plane of the film.
Figure 2C:
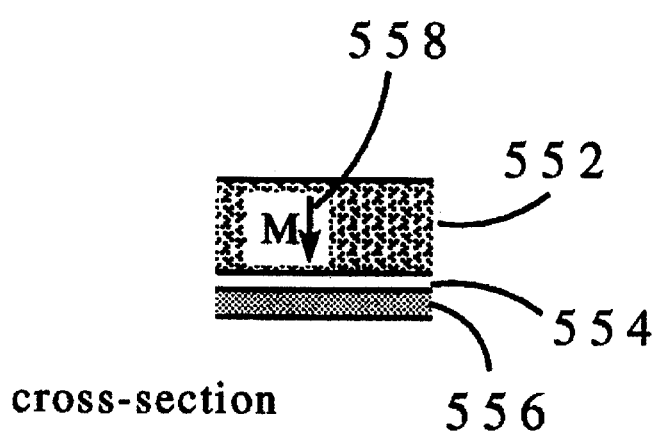
FIG. 2C is a cross-section of the device depicted in FIG. 2B.
Figure 3:
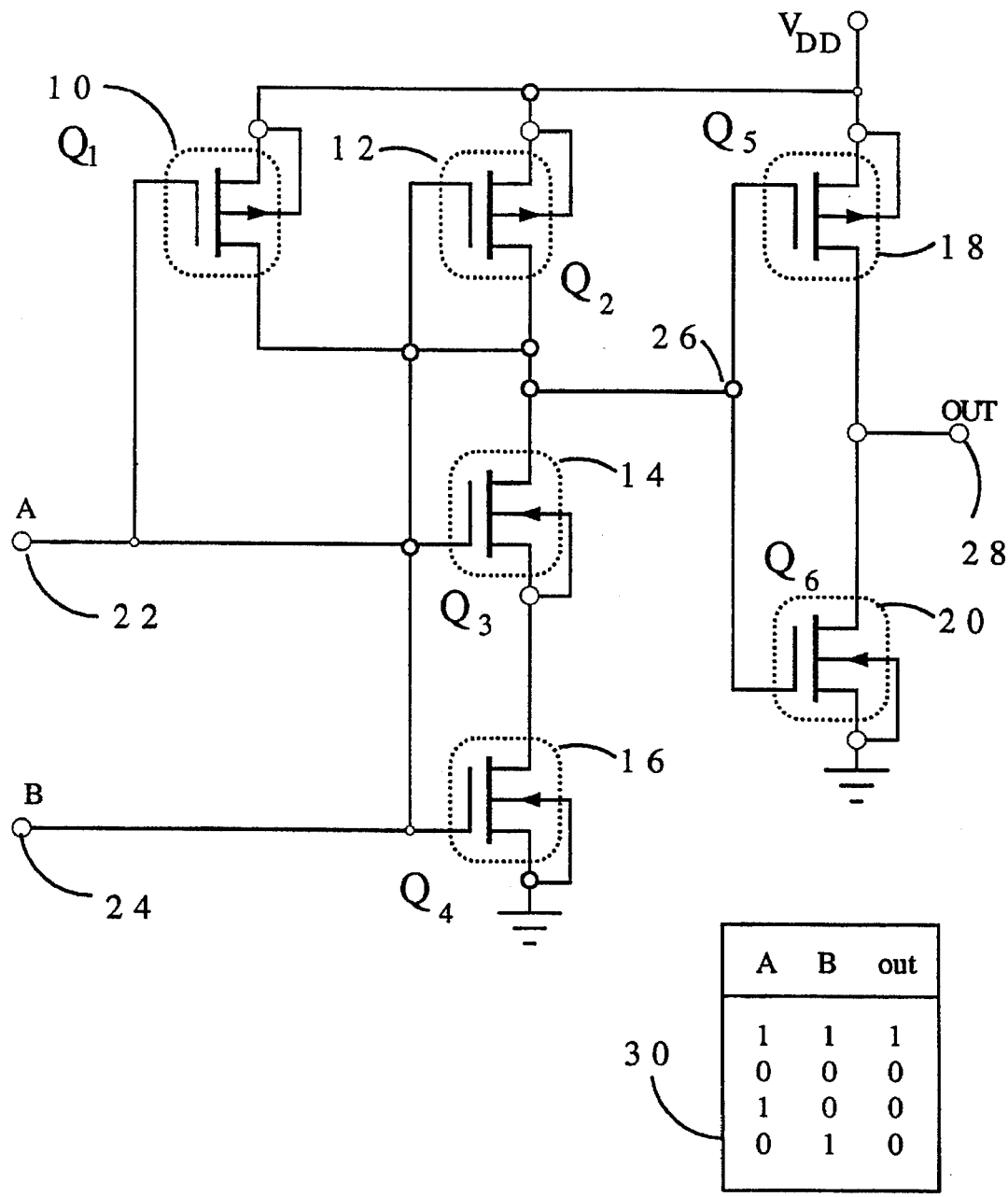
FIG. 3 is a schematic representation of a logical AND gate cell comprised of conventional semiconductor field effect transistors (FETs), and an accompanying truth table.
Figure 4:
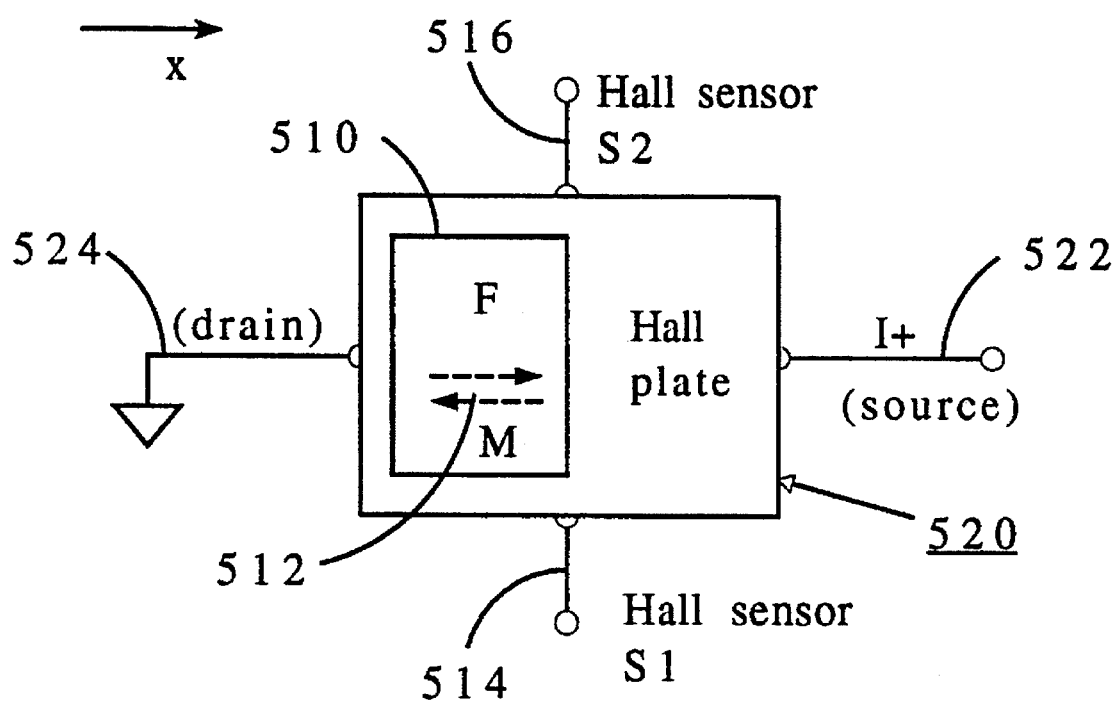
FIG. 4 is a schematic top view of a modified Hall Plate constructed in accordance with the teachings of the present invention, and identifies the general structures found therein.

A schematic view of a modified Hall plate of the present invention is illustrated in FIG. 4. This device is fabricated by covering a portion of a conventional Hall plate with a ferromagnetic film 510, electrically isolated from Hall plate 520, with one edge of film 510 aligned above the axis of the Hall sensing terminals 514 and 516. Ferromagnetic film 510 is fabricated with an anisotropy that preferably constrains the magnetization 512 to the spatial plane of film 510 with an easy axis along ^x. The magnetization of film 510 is therefore oriented (set) to a positive or negative state along an axis perpendicular to the axis of Hall sensing terminals 514 and 516. When the magnetization of ferromagnetic film 510 is positive along +^x, a localized, fringe magnetic field B, beneath the edge, is normal to Hall plate 520 and points downward along −^z. This local field B causes a Lorentz deflection of the carriers in the vicinity of the sensors and the sensed Hall output voltage (a voltage developed between S1 514 and S2 516) has a given polarity (e.g. positive).

When the magnetization of ferromagnetic film 510 is negative, the fringe magnetic field beneath the edge is normal to the Hall plate and points in the opposite direction, along +^z. The Lorentz deflection changes sign, and the output changes polarity (e.g. negative). The polarity convention of Hall output can be reversed by choice of material used for the Hall plate or by changing the polarity of the bias current (or voltage). Thus, the above device has two states, which states are determined by the magnetization orientation 512 of the ferromagnetic film 510: a "1" or "0" corresponds [arbitrarily] to positive or negative magnetization orientation 512.

A data value in the form of a data bit to be stored in the device can be written by using magnetic fields generated by current pulses in overlaid write lines to orient the magnetization in a positive or negative sense. In a write procedure, sending a write current pulse of positive [negative] polarity and magnitude 2 mA down a write line (not shown but located approximately 50 nm away from film 510) generates a magnetic field H (of about 8 Oe) and orients magnetization 512 of ferromagnetic film 510 to be positive [or negative], (where H=8 Oe>$H_c$=4 Oe for a ferromagnetic film 510 composed of permalloy). While the write line is described as a "line" it will be understood by persons skilled in the art that any number of well-known structures capable of carrying sufficient current (including for example a conductive film, or an interconnect line) to generate the field H will be suitable in the present invention. Moreover, while not essential to the description of the present invention, additional details concerning the operation of read/write lines in connection with ferromagnetic layers can be found in the aforementioned pending application Ser. Nos. 08/425884 and 08/493815.

The stored information is nonvolatile and is read by sending a current (or voltage) pulse to bias terminals 522 and 524 of Hall plate 520, and sensing a voltage developed across the Hall sensing terminals 514 and 516; in this particular embodiment a positive voltage representing a "1" and a negative voltage representing a "0".

Figure 6A:
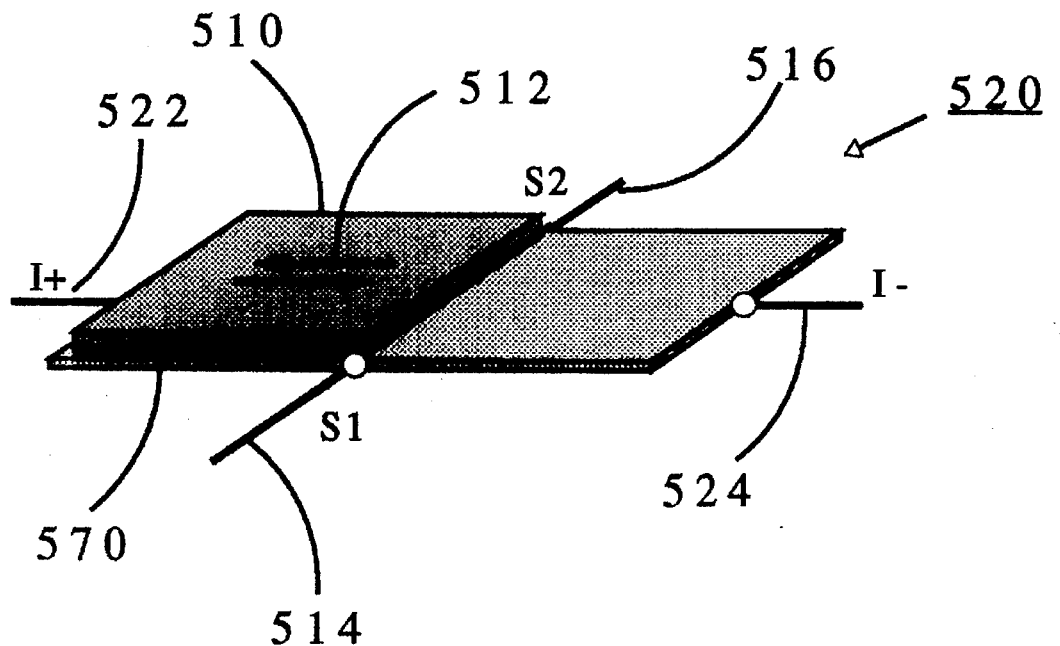
FIG. 6A is a perspective view of the modified Hall Plate shown in FIG. 4, and illustrates a spatial relationship between the ferromagnetic layer, the Hall Plate and the magnetic fields generated in this device.
Figure 6:
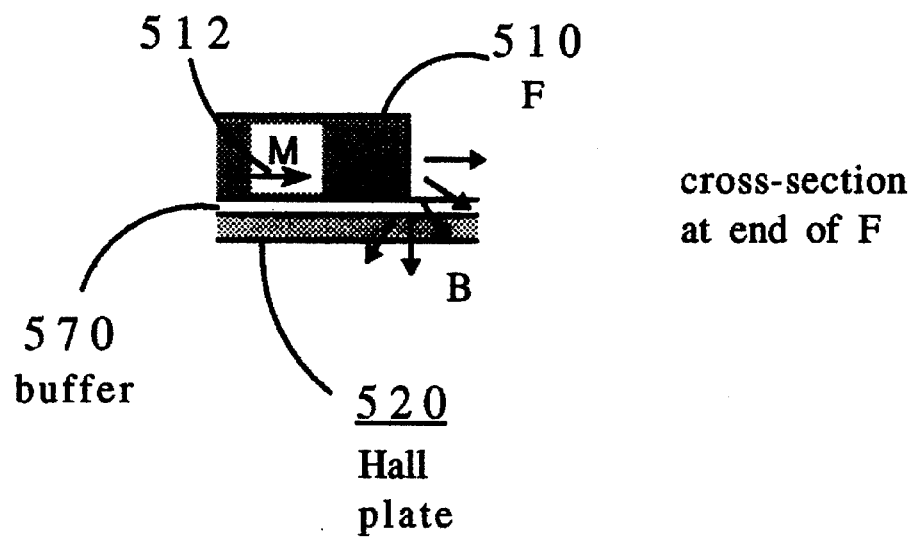
FIG. 6 is a cross-section of the device depicted in FIG. 6A.

A preferred embodiment of the "modified Hall plate" of the present invention is depicted in more detail in FIG. 6A. A ferromagnetic film 510, with in-plane magnetization anisotropy, covers a portion of Hall plate 520. A thin electrically insulating (buffer) layer 570 separates Hall plate 520 from the ferromagnetic layer 510. The coverage is such that one edge of film 510 lines up with the axis of the sense probes S1 514 and S2 516. Ferromagnetic film 510 has a large anisotropy that constrains magnetization 512 to the film plane, and has a weak anisotropy such that there is an easy magnetization axis along the direction of current flow, from 522 to 524. Such an in-plane anisotropy is typically achieved by properly choosing a ferromagnetic material (such as pennalloy, iron or NiCo), proper thickness of material, or other standard magnetic bias techniques known to those familiar in the art. Other non-metallic ferromagnetic materials known in the art are also suitable, such as semi-metals (e.g. a Heusler alloy), certain types of semiconductors, certain types of oxides which have ferromagnetic phases (e.g., perovskite) and other insulators/materials that have ferromagnetic ordering. An anisotropy that provides a uniaxial magnetization axis is achieved by providing a magnetic field at the substrate during ferromagnetic film deposition, by using exchange bias to an appropriate underlayer or overlayer, or by other standard magnetic bias techniques known to those familiar in the art.

Figure 6B:
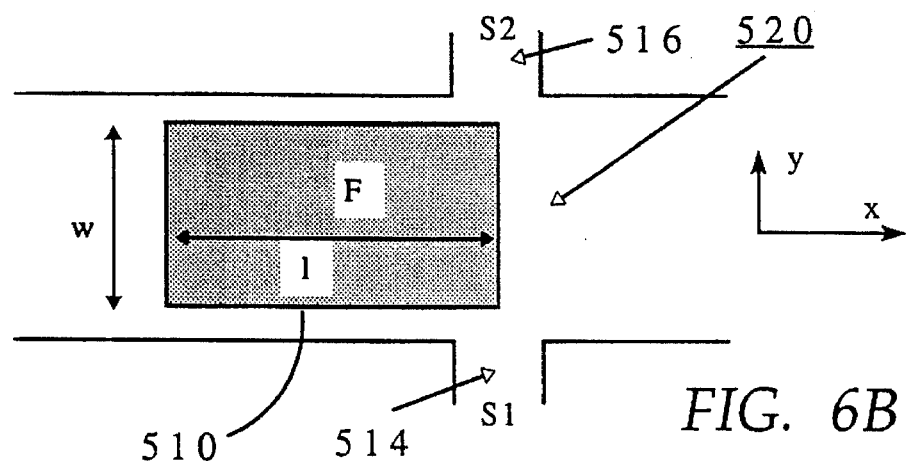
FIG. 6B is a further top view of the modified Hall Plate illustrated in FIG. 4.

Modified Hall plate 520 is depicted further in FIG. 6B in a top view of the device drawn approximately to scale. Width w of film 510 (and the width of Hall plate 520) can be on the order of a few microns or less (in this case 1 micron); length l is approximately the same as the width (in this case about 1.2 microns), and the widths of Hall sensors 514 and 516 are somewhat narrower (in this embodiment about 0.6 to 0.8 microns). The width of film 510 can be slightly smaller or larger than that of Hall plate 520, and need not be perfectly aligned in the center (with respect to ^y). An important characteristic of the present invention, however, is that unlike prior art devices, an edge of film 510 lies along a line connecting Hall sensors 514 and 516. As described above, ferromagnetic layer 510 is fabricated with a magnetic anisotropy so that there is an easy axis of magnetization along ^x.

Under these conditions magnetization ^M of ferromagnetic layer 510 has two stable magnetic orientation states pointing along ^x in a positive or negative sense. A small external field +/−$H_x$, which may be supplied by a stray field from write pulses in contiguous write lines, will orient ^M to be positive or negative. In this context it can be seen that the invention functions as a memory element storing a bit of information. In another embodiment, the small field $H_x$ may originate as an external field associated with stray fields from the magnetization of storage bits on a magnetic medium, in which case the invention will function as a field sensor in a read head.

Figure 6C:
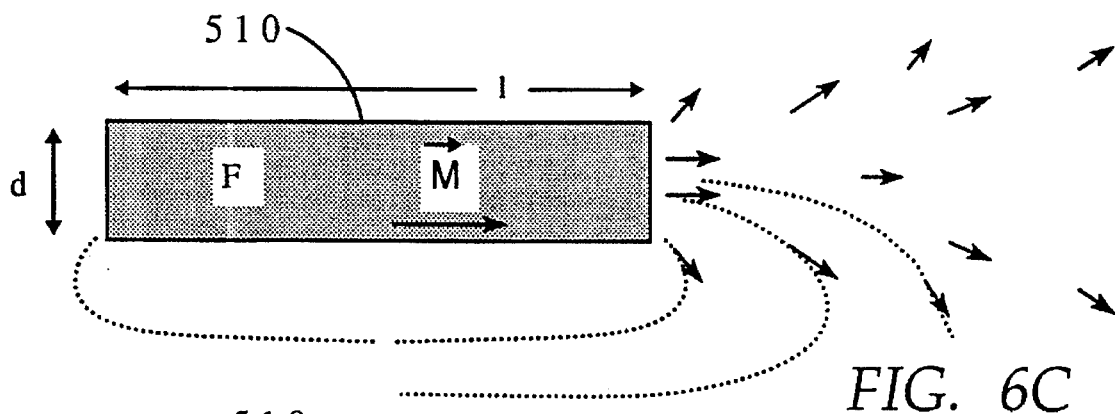
FIG. 6C is a further cross-sectional view of the same modified Hall Plate, not drawn to scale, and illustrates the ferromagnetic layer used in this device, along with the magnetic field generated at the end of this layer when a magnetization of this layer is oriented in a positive direction along ^x.

In cross-section the magnetic field B generated by ferromagnetic film 510 (when ^M is positive) resembles a dipole field of a bar magnet, and is depicted generally in FIG. 6C (this cross-section is not drawn to scale). As shown in this figure, beneath the edge of film 510 is a vector magnetic field B, portions of which are represented in the figure by arrows and dotted field lines. B has a large component $B_z$ in the +/−^z direction. $B_z$ is pointed along −^z for the case when ^M is positive and along +^z when ^M is negative. The magnitude of $B_z$ is a strong function of distance, and diminishes rapidly as the distance increases from the edge of the film.

Figure 6D:
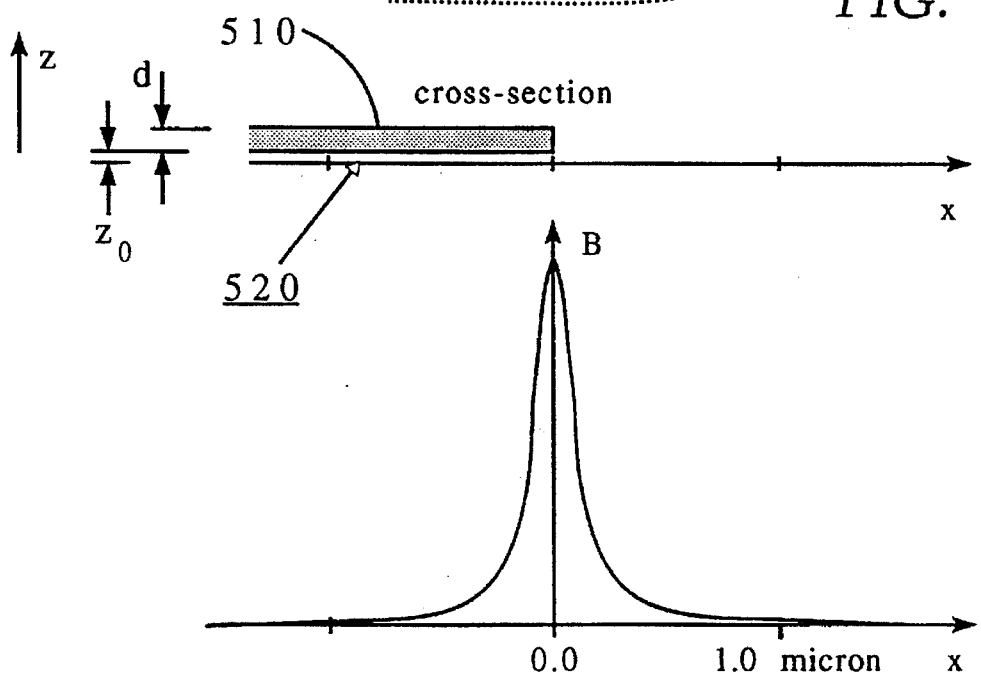
FIG. 6D is a representative sketch of a profile of the magnitude of a perpendicular component $B_z$, of the magnetic field B illustrated in FIG. 6C.

The profile of the length dependence of the magnetic field magnitude depends on the separation $z_0$ between Hall plate 520 and film 510 and on the thickness d of film 510. A typical profile is readily calculated by magnetostatics and is sketched in FIG. 6D for typical values d=130 nm and $z_0$=50 nm. The magnitude of $B_z$ is directly proportional to the saturation magnetization $M_s$ of film 510 (an inherent property of this material) and is approximately linearly proportional to the thickness d of film 510. The proportionality of the magnetic field with d is approximately true in the limit where d is the order of 1 micron or less. Thicker values of d are less practical because of fabrication difficulties and because the in-plane magnetization anisotropy weakens as d becomes thicker than about 0.3 micron. Thicknesses on the order of a fraction of one micron are commonly used in microfabrication processes and are acceptable for the present invention. For permalloy the value of the saturation magnetization $M_s$ is approximately equal to 1000 emu/cm$^3$ and for the above values of d, $z_0$ and $M_s$ the mean field $\overline{B}_z$ in a region 1 micron wide centered at the edge of film 510 is 1000 Oe.

Conceptually, ferromagnetic film 510 acts as a transducer which converts a small externally provided magnetic field $H_x$ into a large, localized magnetic field $B_z$. The magnitude of field $B_z$ can be measured using the classic Hall effect on the carriers in Hall plate 520. A Hall voltage $V_H$ developed between sensors S1 514 and S2 516 (FIG. 6A) is described by the line integral, $$V_H \alpha \int_{S2}^{S1} (\vec{J} \times \vec{B}) \cdot \hat{dl}$$

where J is the bias current density, B is the magnetic field and dl is the unit vector of the integral. The present invention makes use of the discovery that there can be a substantial Hall voltage even when the magnetic field is not uniform over the area of Hall plate 520, as long as an edge of film 510 is kept relatively well aligned over the path of the line integral as given in the above equation and shown in FIG. 6A. In an actual embodiment (FIG. 6B) Hall probes S1 514 and S2 516 have finite width $w_s$, and this width can be made to be the order of one micron. It is apparent from the above analysis and explanation that the Hall effect works better for smaller values of $w_s$, as well as for small values of $z_0$. In these cases the Hall voltage can be approximated by using an average value of magnetic field $B_{av}$, $$V_H \alpha \int_{S2}^{S1} (\vec{J} \times \vec{B}_{av}) \cdot \hat{dl}$$

Since the value of $B_{av}$ increases if the average is taken over a narrower width $w_s$ (and, in a more complete analysis, over narrower width w), it is seen that the Hall voltage $V_H$ gets larger as the dimensions are reduced. In other words, the device has inverse scaling: its characteristics improve as the dimensions are reduced, and this is a significant improvement over prior art Hall devices.

Using the value of $B_{av}$ estimated above to be 1000 Oe for 130 nm thick permalloy and $w_s$=1 μm, values of $V_H$ can be estimated for several materials. For gallium arsenide with a typical Hall mobility of $\mu_H \approx 0.9$ m²V⁻¹ sec⁻¹ the value of $V_H$ is expected to be $V_H$=0.067 V per volt of readout bias. For low doped n-type silicon with a Hall mobility of $\mu_H \approx 0.17$ m²V⁻¹ sec⁻¹ the value of $V_H$ is expected to be $V_H$=0.013 V per volt of readout bias. Those skilled in the art will understand that these values can be increased by increasing the thickness of ferromagnetic layer 510, by using a ferromagnetic material with a larger saturation magnetization (such as iron), or by adjusting other appropriate parameters.

In a further variation of the present invention, a second ferromagnetic film 510' (not shown) can be added to another side of the Hall plate 520 opposite to the first film 510, with the edge of each film aligned along the axis of sensors S1 and S2. While the fabrication of such a device may be somewhat more complex, it also has the advantage of providing a slightly stronger fringe field which may be desirable in some environments.

As explained above, ferromagnetic materials with in-plane anisotropy are preferred in the context of the present invention, because they tend to have lower coercivities. However, materials with perpendicular anisotropies are equally usable in some applications of the present invention since the coercivity is not a critical parameter in many environments. In these embodiments the ferromagnetic film is preferably small (on the order of the width of sensors S1 and S2) and the orientation is lined up along a path between the sensors. Other geometries and structures will be apparent to those skilled in the art.

The sensed voltage $V_H$ is bipolar, having a positive value when ^M is positive and a negative value (with the same magnitude) when ^M is negative. The output can be biased up or down, e.g. to span a range 0 to 2 $V_H$, by using a slight offset in the relative position of S1 514 and S2 516. Furthermore, unless a bipolar output is desired, readout can be achieved with a single sensor referenced to any convenient terminal, such as 522 or 524. Readout can also be achieved, with some loss of sensitivity, as a change in the resistance measured from terminal 522 to 524.

Previous Hall devices [refer to device by Popovi'c cited above] that incorporated ferromagnetic films to focus external field were designed to deliver a homogeneous field over a relatively large area of a vertical Hall plate, and intentionally placed the ferromagnetic components away from the central region of the Hall plate. This limited the sensitivity as a field sensor, was expensive to fabricate because of the unusual vertical structure, and showed no memory effect that could be used for storage or logic applications.

The present invention makes use of a new insight: namely, that a significant Hall voltage can be generated by an inhomogeneous, local, magnetic field that has appreciable magnitude primarily along the path of the line integral between Hall sensors. By utilizing conventional lithographic techniques which enable the fabrication of narrow sensors, (and narrow Hall plates), the present invention produces a device with much greater sensitivity [i.e. analyzed as a transducer, the device converts an external field along ^x, $H_x$, to a local field along ^z, $B_z$, and the gain describing the ratio $B_z$ to $H_x$ is about 250 (or higher), much larger than that of prior art devices] making it a more efficient field sensor. It furthermore produces a device suitable for use as a memory element.

The prior art "Magnetic Field Sensor" was designed to produce a homogeneous field over a large area. Analyzed as a transducer, it converted an external field along ^y, $H_y$, to a slightly larger field along ^y, $B_y$, with a gain of about 10. The device was not scalable, and thus could not be shrunk for use as an integrated microfabricated element. By contrast, the gain of the present invention (analyzed as a transducer) is 250 or greater, i.e. about 25 times larger, and has inverse scalability so that it is ideal for microfabrication and integrated applications.

Compared with the prior art device described by Harbison, the present invention has greater gain, and therefore can use write currents of much smaller amplitude so as to draw less power. Furthermore it can be fabricated from simple, inexpensive materials such as permalloy, iron, cobalt, etc. and is compatible with silicon based device technology.

Figure 7A:
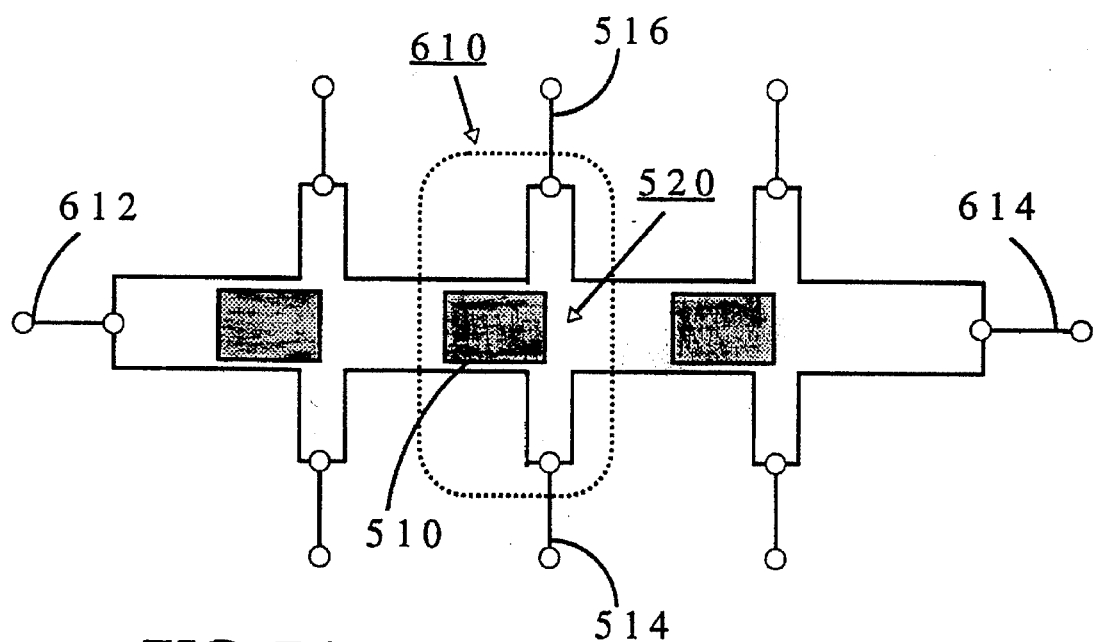
FIG. 7 is a top view of a further embodiment of the present invention including a memory array having modified Hall Effect devices operating as single memory cells, and writing to the cells is performed using sense leads of the Hall Plate.
FIG. 7B is a top view of a further embodiment of the present invention including a memory array having modified Hall Effect devices operating as single memory cells, and writing to the cells is performed using additional write leads.

The modified Hall Effect device can be used as a single element in a single element memory cell, and an array of cells can be fabricated as a nonvolatile random access memory, as depicted in FIG. 7A. Any material with suitable Hall mobility can be used for the Hall plate, such as thin films of bismuth, gallium arsenide, or doped silicon. A bit can be written in cell 610 by sending a write pulse of positive or negative polarity through sense leads 514 and 516, orienting the magnetization of ferromagnetic film 510 to be positive or negative (e.g. "1" or "0"). In this embodiment, write current amplitudes can be of the order of 1 mA.

The stored bit is nonvolatile, and does not need to be refreshed. It can be read at a later time by biasing with a current or voltage between terminals 612 to 614 and sensing a Hall voltage developed between sense probes 514 and 516. In this embodiment, a positive voltage corresponds to a "1" and negative voltage corresponds to a "0". It will be understood by those in the art that the read process can also use a different combination of leads, such as by biasing with leads 514 and 516 and sensing a voltage between leads 612 and 614. The only important consideration is that a read current magnitude should be less than the write magnitude; if not there is a potential in some applications for a destructive readout and the bit may need to be rewritten.

The memory depicted in FIG. 7A is fully integrated, nonvolatile, and has typical dimensions of 2 μm by 2 μm per cell giving a packing densities already at least twice as large as conventional DRAM. Moreover, unlike prior art devices, the nature of the present invention is such that it should permit even greater performance characteristics as the device dimensions are reduced. As processing and lithographic techniques improve, therefore, it is expected that devices constructed in accordance with the teachings herein will be reduced even further in size.

Figure 7B:
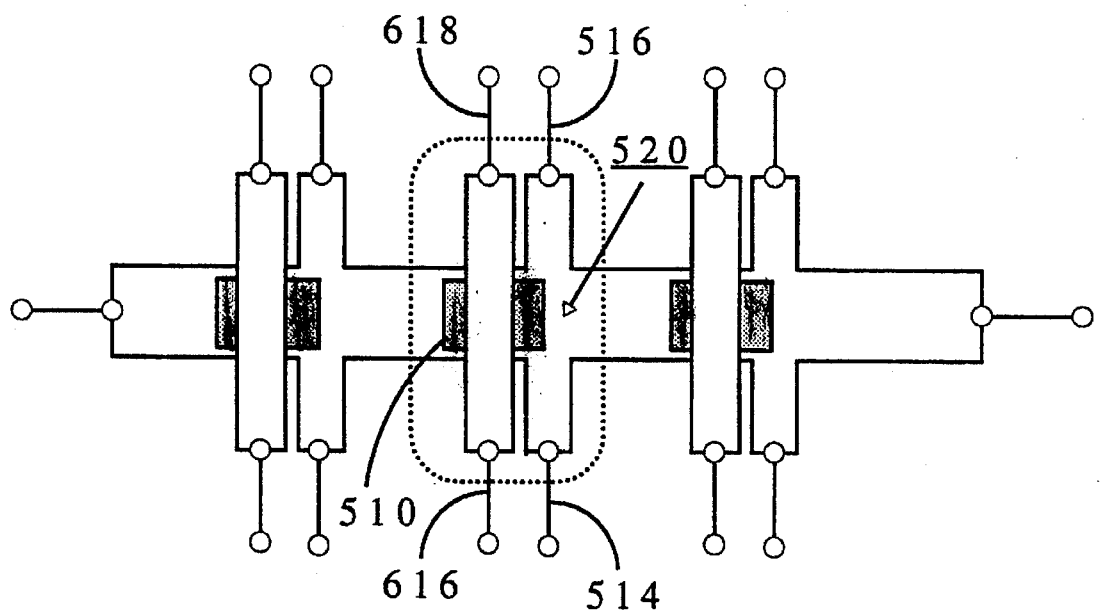

The array depicted in FIG. 7A uses a particularly simple cell and has the advantage of a simple architecture. A separate array of write lines can also be provided, separated from the rest of the device by an insulating layer, as depicted in FIG. 7B. This embodiment may be more preferable in low power environments to avoid potential power dissipation caused by the high resistance of the sense lines 514 and 516 during a write process. In this arrangement, a bit can be written to cell 610 by sending a write pulse of positive or negative polarity through write line leads 616 and 618, which are on the order of 0.6 to 0.8 microns in width. The read operation is the same as described above.

Ferromagnetic Gated FET

When the Hall plate is fabricated as the conducting channel of a FET and the ferromagnetic film is incorporated in (or near) the channel gate, the device operates as a ferromagnetic gated FET (described in detail below). Write and read functions are performed as with the modified Hall plate, but in this case the element has two additional states determined by the gate voltage: in the "on" state the channel conductance is high and in the "off" state the conductance is negligibly small. Thus, the ferromagnetic gated FET is normally isolated from an array of elements by the infinite impedance of the "off" state. The stored bit is read by sending a voltage pulse to the gate, raising the conductance of the channel and setting the FET to the "on" state, and then sensing the voltage developed across Hall sensor probes on the device.

Figure 8A:
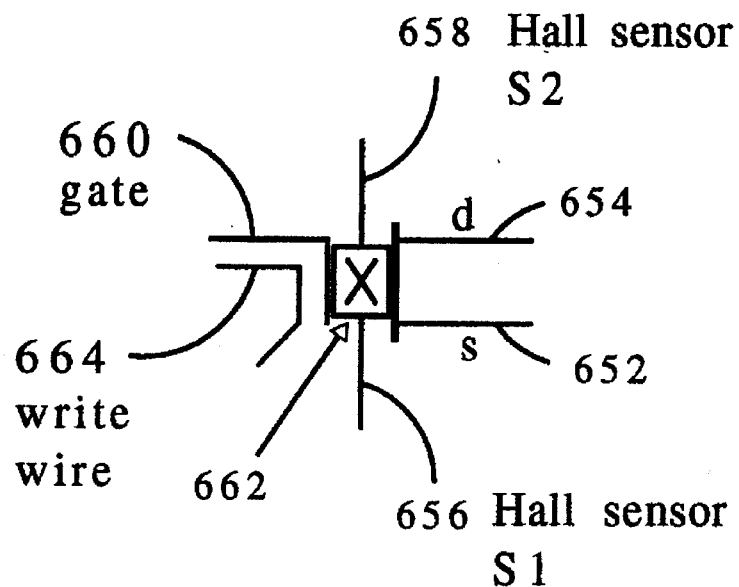
FIG. 8A is a schematic cross-sectional view of a further embodiment of the present invention including a ferromagnetic gated FET comprised of a modified Hall Plate integrated with a conventional FET.

The diagram of FIG. 8A represents a gated FET (e.g. an enhancement mode device) whose conducting channel functions as a Hall plate, and which has a write line 664 inductively coupled to ferromagnetic layer at the gate 660 of the FET. A current (or voltage) bias is provided (typically) from source 652 to drain 654 of the FET, and two additional terminals 656 and 658 are added to channel 662 for sensing a Hall voltage.

Figure 8B:
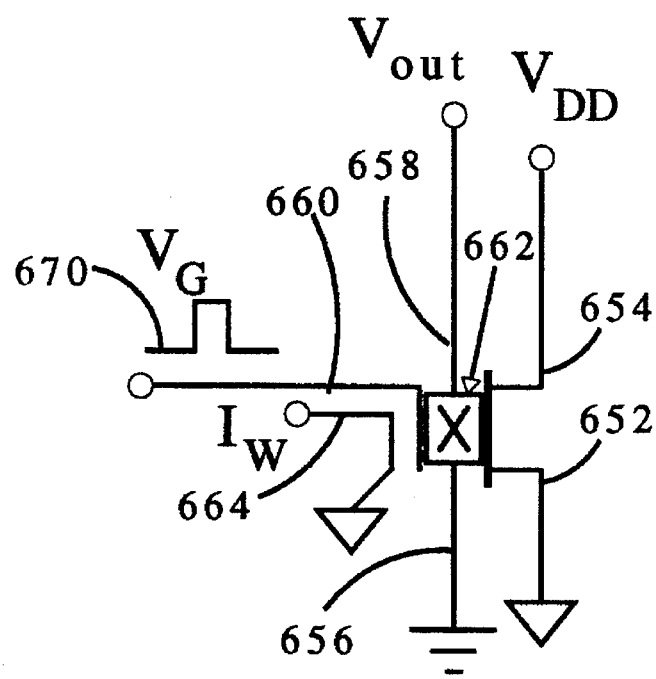
FIG. 8B is a schematic cross-sectional view of a further embodiment of the present invention including a ferromagnetic gated FET which operates as a memory cell, and an inductively coupled write line used for writing a bit to this cell.
Figure 8C:
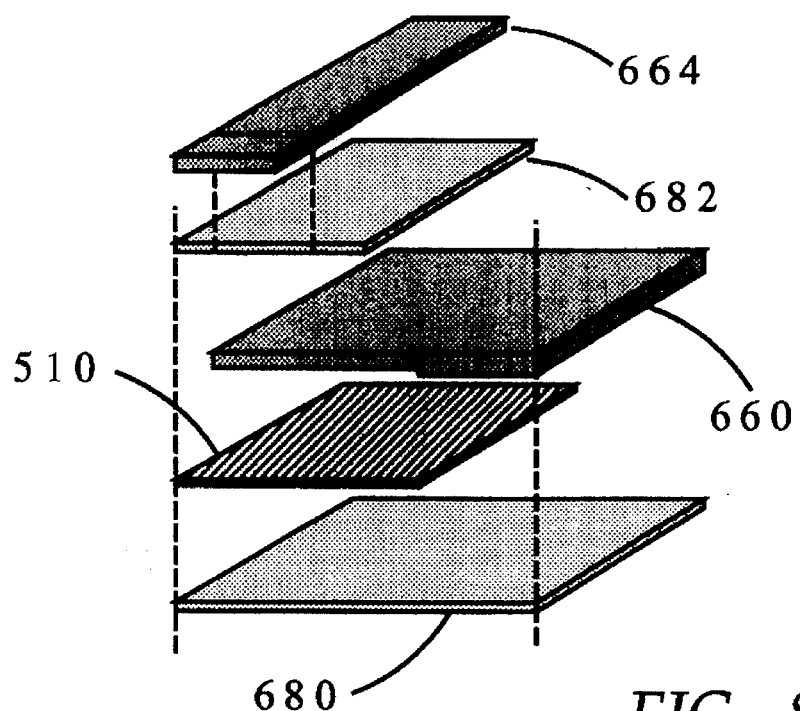
FIG. 8C is an exploded view of a write line used for inductively coupling to a ferromagnetic layer incorporated in or near a gate of the ferromagnetic gated FET.
Figure 8D:
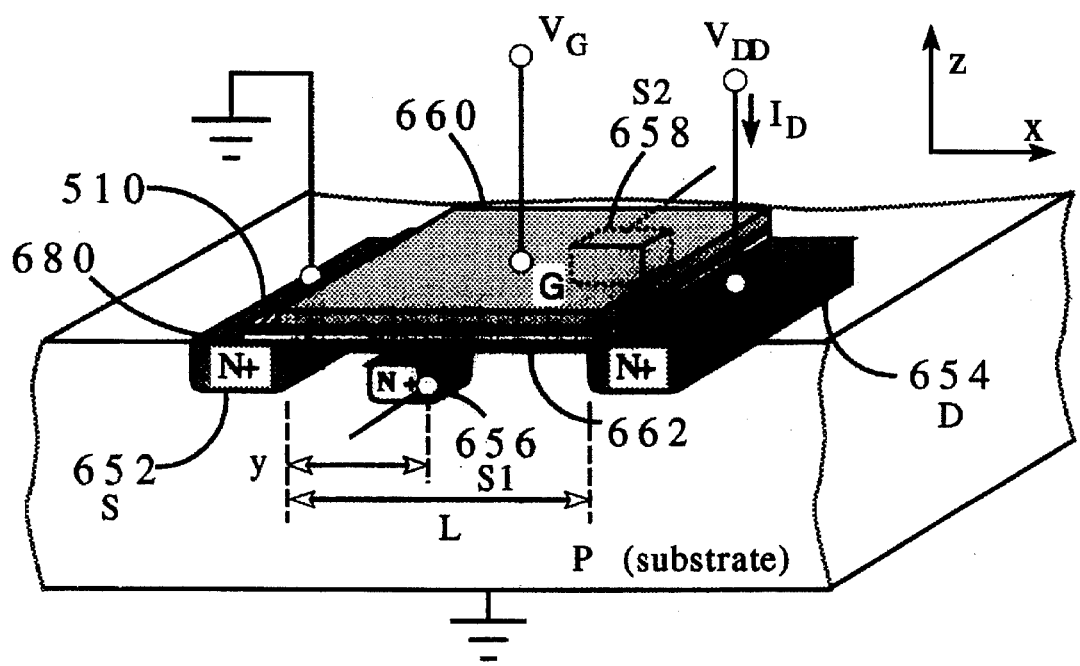
FIG. 8D is a perspective view of one preferred implementation of the ferromagnetic gated FET of the present invention.

As seen in FIG. 8D, ferromagnetic film 510 can be integrally included as a portion of gate 660, or alternatively, as a separate layer. The conductance of channel 662 of the FET is determined by a control voltage, $V_G$, applied to gate 660, which controls the conductance to be close to zero ("off") or relatively high ("on"). A write line 664 is located contiguous to ferromagnetic film 510, so that driving a positive current pulse $I_w$ through wire 664 orients ^M along positive ^x (hereafter referred to as a "plus" direction, or equivalently "up") and driving a negative current pulse $-I_w$ through wire 664 orients ^M along negative ^x (hereafter referred to as a "minus" direction, equivalently "down").

A preferred embodiment illustrating the use of the present device as a memory cell is depicted schematically in FIG. 8B. Drain 654 is biased by voltage $V_{DD}$ and source 652 is grounded. One of Hall sense lines 656 is grounded (e.g. to a separate ground), and an output voltage $V_{out}$ is measured (relative to this ground) at an opposite Hall sense line 658. If the magnetization state of film 510 is oriented in the plus, or up, direction (+^M), then the two state device can be described as storing a positive data value ("1"); similarly, if ^M is oriented in the minus, or down, direction (−^M) then the state stored is a negative data value ("0").

A data value (bit) is written to the device by using magnetic fields from current pulses in overlaid write lines 664 [see also FIGS. 8C and 8D], in analogy with the write operations described above, to orient ^M either plus or minus. The stored data bit is nonvolatile, and is isolated from other elements in an array of elements because the conductance of channel 662 also has two settable states: approximately zero conductance (infinite impedance) in the "off" state when no gate voltage is applied (e.g. an enhancement mode FET), and high conductance in the "on" state when a suitable voltage is applied to gate 660. The stored bit is read by sending a control voltage pulse 670 to the gate 660, raising the conductance of channel 662 and setting the FET to the "on" state, while the drain is biased with voltage $V_{DD}$. The output voltage $V_{out}$ can then be sensed to determine the value of the bit stored in the device; i.e, whether a positive or negative data value ("1" or "0") is present.

A cross section of the preferred embodiment of the ferromagnetic gated FET is depicted in FIG. 8D where ferromagnetic layer 510 has been incorporated in an enhancement mode n-channel FET. Channel 662 length L, from source 652 to drain 654, in typical MOSFET structures is the order of one micron. A thin insulator 680 separates gate 660 from channel 662. As mentioned above, ferromagnetic layer 510 may be incorporated as part of the gate, or may be fabricated separately. Hall sensor probes 656 and 658 can be fabricated at the edges of channel 662 using doped silicon in a process similar to that used for fabricating a typical source 652 and drain 654. The position y of these probes along the length of channel 662 can be optimized for maximum signal.

Write line 664 (or several write lines, if an array is used) is electrically isolated from the device by a thin insulating layer 682. This is shown in an exploded view (FIG. 8C) of write line 664, insulating layer 682, gate 660, ferromagnetic layer 510, and insulator 680 above conducting channel 662. Alternative geometries and layouts will be apparent to those skilled in the art; for example, a portion of the conducting path for the write current may traverse all or part of gate 660.

A typical MOSFET has a Hall mobility of $\mu_H \approx 0.06$ m$^2$V$^{-1}$sec$^{-1}$, so that the magnitude of the readout voltage in the above embodiment is approximately $V_H = 0.02$ V (when $V_G = 10$ V and $V_T = 0.55$ V). The resulting signal to noise ratio is superior to that of DRAM and to that of competing nonvolatile memory technology.

The device may also be used as a field sensor, e.g. in a recording head. Note that the readout voltage can be increased by varying parameters such as the type of ferromagnetic material and thickness. For example, iron films have approximately twice the saturation magnetization as permalloy, and substituting iron for permalloy would double the magnitude of the readout voltage.

Figure 9:
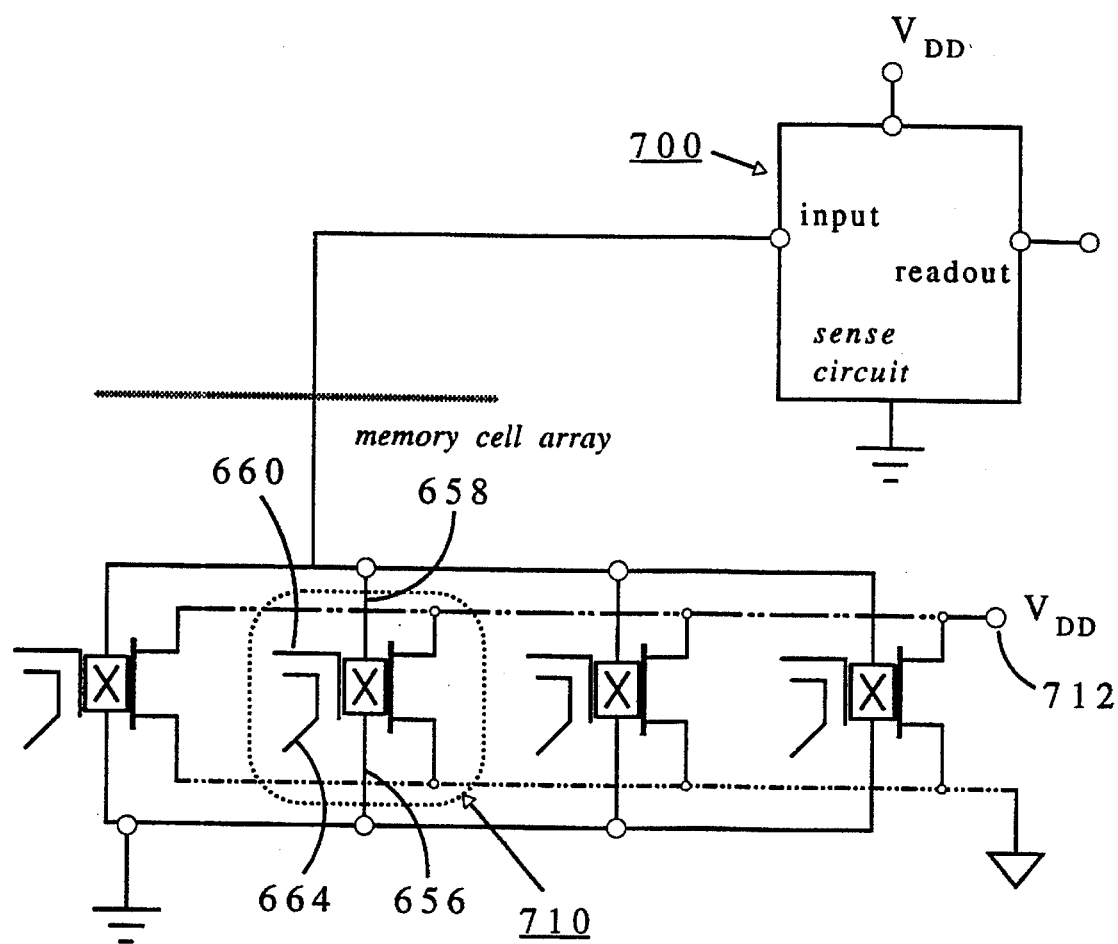
FIG. 9 is a schematic view of a further embodiment of the present invention in which a number of ferromagnetic gated FETs are used as memory cells and arranged to form a memory array in combination with a sense circuit that is used for reading the data bit stored in a single cell.

A number of ferromagnetic gated FET memory cells can be fabricated to form an array, as is depicted in FIG. 9. Each element is electrically isolated from the array unless it is addressed, and all elements in the array share the same sense circuit 700. A bit is written to element 710 by sending an appropriate write pulse through write line 664. The bit is read by sending a voltage pulse $V_G$ to gate 660 while a bias voltage $V_{DD}$ 712 is applied. A Hall voltage from element 710 alone will be generated across sense leads 656 and 658 and transmitted to sense circuit 700 for readout.

The Lorentz force that generates the transverse Hall voltage $V_H$ also has an effect on the resistance $R_{xx}$ of the channel, where $R_{xx}$ is measured along the direction of current flow from source to drain, and is referred to as a magnetoresistance. The difference in resistance, $\delta R_{xx}$, for the two states of magnetization $+/-\hat{}M$ is smaller than the Hall resistance, $R_{xy}$ (where $R_{xy}$ is defined by the relation $V_H = I \cdot R_{xy}$). Thus, while it is possible to sense the state of the device by using the magnetoresistive effect as well, readout of the Hall voltage provides a more sensitive determination of the state of the device. It is apparent to those familiar with the art that it may be preferable, but is not necessary, to use two sensors to sense the Hall resistance $R_{xy}$. A single sensor can be used, for example, along with any convenient ground.

The ferromagnetic gated Hall plate is an improvement over DRAM because the memory cell has a single element so that packing densities are greater. It also has superior signal to noise ratio, and the memory is nonvolatile so that the array draws substantially less power. The ferromagnetic gated Hall plate is an improvement over other nonvolatile technologies because the cell is simpler, packing densities are greater, signal to noise is superior, and isolation from the array is more efficient. The ferromagnetic gated Hall plate differs from the modified Hall plate because it shares the same architecture as DRAM, and because isolation from the array is superior.

Ferromagnetic Gated FET as Logic Gate

Boolean logic processes can also be performed using the present ferromagnetic gated FET. For example, a logic input having two logical data values can be represented by two different current levels on a data wire. This logical input (having a particular current level corresponding to a "1" or "0") can be combined with a second logical input (also having a current level corresponding to either a "1" or "0"), and the combined sum of the current levels of these logical inputs then can be applied to a write line coupled magnetically to a ferromagnetic layer of the FET. The sum of these logic inputs constitutes a write current pulse in the write line and a corresponding magnetic field acts inductively on the magnetization state $\hat{}M$ of the ferromagnetic layer. Depending on the state of the orientation $\hat{}M$ of the ferromagnetic layer, and the particular combination of inputs therefore, the magnetic field of the write current pulse may alter this orientation, thus "storing" the result of the logic operation in the form of a new magnetization orientation in the ferromagnetic layer. Again, while not essential to the description of the present invention, additional details concerning structures and circuits usable in connection with magnetic spin transistor boolean logic processing devices can be found in the aforementioned pending application Ser. Nos. 08/425884 and 08/493815.

Those skilled in the art will appreciate that this principle can be extended to create an n input logical AND gate or similar logic processor. For example, a logic processing device can be implemented wherein the magnetization state of the drain of the FET is given n easy axes of orientation and is set so that it can be altered only when all n inputs are a "high" current level, thus generating a sufficiently high magnetic field to change the orientation of the FET ferromagnetic layer. Other configurations for adapting other boolean processes will be readily apparent to skilled artisans.

The result for the general n-state device, (or for the two-state device of the present discussion) is automatically stored as a boolean function data value and can be read out at any later time. In this way the ferromagnetic gated FET can function as a logic gate with memory capability. If the readout operation enables the result ("0" or "1", HIGH or LOW) to be transmitted to another gate for another operation, then gates can be linked together to perform combinational tasks of digital processing. An example of an appropriate readout technique is presented in FIG. 10. Readout circuit 750 amplifies an output to an appropriate CMOS level (HIGH or LOW) so that it can be integrated with CMOS (or, for an appropriate circuit, TTL) logic. Alternatively, the output can be sent to the write line of another ferromagnetic gated FET.

Figure 10:
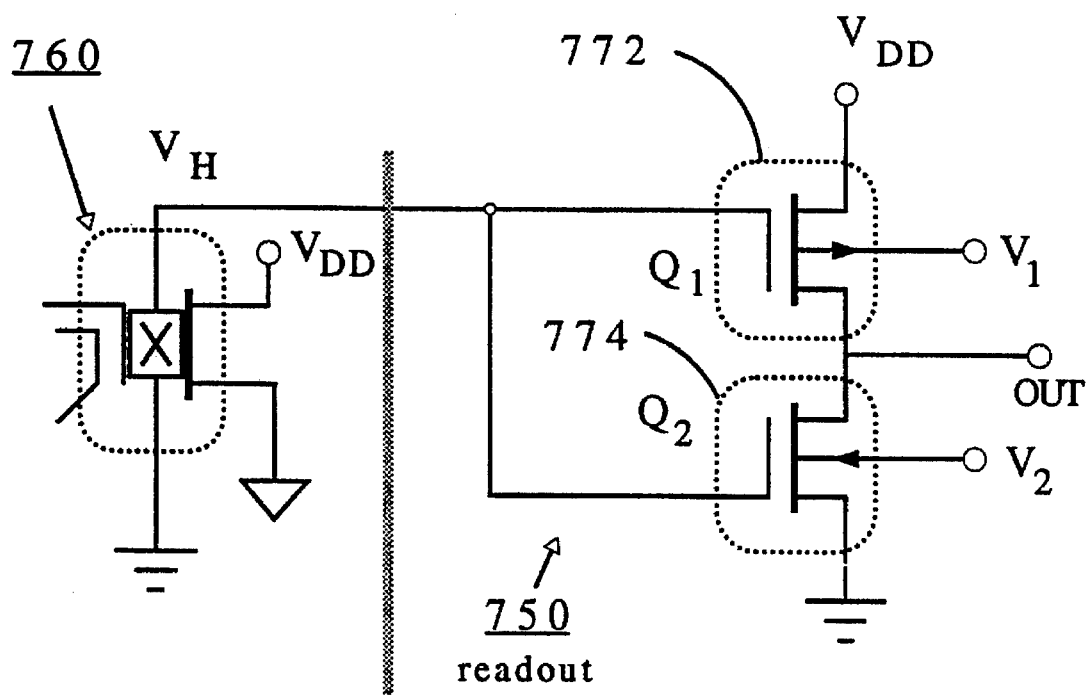
FIG. 10 is a schematic view of a further embodiment of the present invention which includes a ferromagnetic gated FET used as a logic gate and a readout circuit that can be used therewith.

The example of FIG. 10 is presented for the case of an n-channel enhancement mode ferromagnetic gated FET. Ferromagnetic gated FET 760 has two Hall voltages in the "on" state, $+/-V_H$. In a typical MOSFET device, $V_H$ may typically have a value $V_H = +/-0.5$ Volt when biased by voltage $V_{DD} = 15$ Volts. In readout circuit 750, FET $Q_1$ 772 is an n-channel enhancement mode FET whose body is biased to ground ($V_1 = 0$). FET $Q_2$ 774 is a p-channel enhancement mode FET whose body is biased at ground ($V_2 = 0$). More generally, the bodies of FETs $Q_1$ 772 and $Q_2$ 774 can be biased to variable voltage values $V_1$ and $V_2$. In the general case where ferromagnetic layers with n separate magnetization states are used, then there are n possible stable values of voltage that can be read out. Biasing the bodies of FETs $Q_1$ 772 and $Q_2$ 774 to appropriate voltage values permits the discrimination of the n possible data values of the n-state ferromagnetic gated FET.

For the binary case of FIG. 10, when $V_H$ is HIGH (0.5 Volt), $Q_1$ 772 is "on", $Q_2$ 774 is "off" and the output is clamped HIGH (VDD). When $V_H$ is LOW (−0.5 Volt), $Q_1$ 772 is "off", $Q_2$ 774 is "on" and the output is clamped LOW (ground). As a result of the readout, the output values are reset to CMOS levels (VDD and ground). When the elements of FIG. 10 are taken as a single gate, the number of constituent elements is three, only half the size of the typical CMOS gate, and the packing density of logic gates can be increased. Since no additional memory element is needed to store the result, additional increases in packing density can be achieved. Furthermore, it is possible to associate a single readout cell with several ferromagnetic gated FETs. Each of the latter can perform a programmed Boolean operation, and the results are stored and can be called in any sequence when needed. The readout circuit depicted in FIG. 10 is only one of several possible circuits.

Although the present invention has been described in terms of a preferred embodiment, it will be apparent to those skilled in the art that many alterations and modifications may be made to such embodiments without departing from the teachings of the present invention. For example, while not shown or discussed explicitly herein, it will be apparent to those skilled in the art that additional peripheral and support circuits commonly associated with semiconductor memory arrays (decoders, buffers, latches, equalization, precharge, etc) can be easily adapted for use with the present invention. Moreover, while the preferred embodiment is shown to be an enhancement mode FET, other active devices (depletion mode, p-channel, etc.) can be fabricated using well known techniques to include the teachings of the present invention.

Furthermore, other suitable FET orientations and geometries, including those having lightly doped source/drains, vertical topologies, etc. can be used with the present invention.

In addition, it will be apparent to those skilled in the art that a device can be constructed in a stacked fashion, i.e., having multiple levels of the memory cells or logic gates of the present invention. This can be accomplished merely by adding a passivating layer or similar insulating layer between such levels, along with appropriate conventional interconnect and peripheral support circuits. Thus, a device constructed in this manner can have even greater integration advantages over prior art.

Accordingly, it is intended that all such alterations and equivalent modifications be included within the scope and spirit of the invention as defined by the appended claims.

What is claimed is:

1. An improved Hall Effect device comprising:
   a conductive film layer having a top surface and capable of carrying an electrical current;
   a ferromagnetic layer having a configurable magnetization orientation, and covering a first portion of the top surface, and not a second portion, such that a fringe magnetic field substantially normal to such surface can be generated by an edge portion of the ferromagnetic layer; and
   wherein an electrical signal can be generated in response to the fringe magnetic field acting on the electrical current in the conductive film layer.

2. The device of claim 1, further including a first sensor coupled to a first edge of the conductive film layer, and a second sensor coupled to a second edge of the conductive film layer, opposite to the first edge, such that the electrical signal is a voltage generated substantially along an axis joining the first and second sensors.

3. The device of claim 1, wherein the conductive film layer and the ferromagnetic layer are separated by an insulating layer.

4. The device of claim 1, wherein the electrical current flows between a first bias terminal coupled to a third edge of the conductive film layer, and a second bias terminal coupled to a fourth edge of the conductive film layer, opposite to the third edge.

5. The device of claim 1, further including a write line for configuring the magnetization orientation in the ferromagnetic layer.

6. The device of claim 1, wherein the ferromagnetic layer is coupled to a magnetic field generated by magnetically recorded data, the electrical signal generated is related to a value of the data, and the device operates as a magnetic field sensor.

7. The device of claim 2, wherein the ferromagnetic layer has an easy magnetization axis that is substantially parallel to the electrical current and substantially perpendicular to the axis joining the first and second sensors.

8. A memory device comprising:
   a conductive film layer having a top surface;
   a ferromagnetic layer having at least two configurable and stable magnetization orientation states corresponding to two different values of a data item stored in said device, and covering a portion of the top surface such that a fringe magnetic field having two states and configured substantially normal to the top surface can be generated by an edge portion of the ferromagnetic layer; and
   wherein two different electrical signals, each corresponding to a different one of the two different data values, can be generated in response to the two fringe magnetization field states acting on an electrical current flowing in the conductive film layer.

9. The device of claim 8, further including a first sensor coupled to a first edge of the conductive film layer, and a second sensor coupled to a second edge of the conductive film layer, opposite to the first edge, such that the two different electrical signals are voltages generated substantially along an axis joining the first and second sensors.

10. The device of claim 9, wherein the two electrical signals comprise a first voltage output signal when a first value of the data item is stored in said device, and a second voltage output value when a second value of the data item is stored in said device.

11. The device of claim 10 further including a sense circuit for comparing the two electrical signals of the device with a reference value to determine the value of the data item stored in said device.

12. The device of claim 8, wherein the electrical current is a read current that flows between a first bias terminal coupled to a third edge of the conductive film layer, and a second bias terminal coupled to a fourth edge of the conductive film layer, opposite to the third edge.

13. The device of claim 8, further including a write line for configuring the two configurable magnetization orientation states in the ferromagnetic layer.

14. The device of claim 8, wherein the ferromagnetic layer has an easy magnetization axis that is substantially parallel to the electrical current and substantially perpendicular to the axis joining the first and second sensors.

15. The device of claim 8, wherein the magnetization orientation of the ferromagnetic layer:
   (i) can be set to a first state in response to a first amplitude write current and associated first write magnetic field; and
   (ii) can be set to a second state in response to a second amplitude write current and associated second write magnetic field.

16. The device of claim 15, wherein the ferromagnetic layer magnetization orientation is retained in said state until a different state is set in said layer.

17. The device of claim 8, further including a plurality of said memory devices coupled together to form a memory array.

18. The device of claim 8, wherein the ferromagnetic layer is a 130 nm thin film of iron, cobalt or permalloy, the conductive film layer material is a 1 micron wide gallium arsenide plate, and the two layers are separated by an insulating layer of oxide 50 nm in thickness.

19. A logic device for implementing a logic function relating a combination of one or more input signals to an output signal comprising:
   a conductive film layer having a top surface;
   a ferromagnetic layer having at least two stable magnetization orientation states and covering a portion of the top surface such that a fringe magnetic field can be generated substantially normal to the top surface by an edge portion of the ferromagnetic layer; and
   a write line for inductively coupling the ferromagnetic layer with a magnetic field generated by said input data signals on the wire, the input data signals having one of a first and a second current value, and
   an electrical output signal generated in response to the fringe magnetic field acting on an electrical current flowing in the conductive film layer, and wherein the electrical output signal relates to said input signals and to said logic function.

20. The device of claim 19, wherein the electrical output signal has a first value when the ferromagnetic layer magnetization orientation state is altered by magnetic fields corresponding to a first combination of said input data signals related to said logic function, and the electrical ouput signal has a second value when the ferromagnetic layer magnetization state is not altered by magnetic fields corresponding to a second combination of said input data signals.

21. The device of claim 19, wherein the magnetization orientation state of the ferromagnetic layer corresponds to a result of said logic function implemented in said device, and this result is stored in said device until the magnetization orientation state is altered by a subsequent combination of input signals.

22. The device of claim 21, wherein the magnetization state of the ferromagnetic layer can be set initially based on the logical function to be implemented by said device.

23. The device of claim 22, further including a first sensor coupled to a first edge of the conductive film layer, and a second sensor coupled to a second edge of the conductive film layer, opposite to the first edge, such that the electrical signal is a voltage generated substantially along an axis joining the first and second sensors.

24. The device of claim 21 further including a sense circuit for comparing the electrical output signal of the device with a reference value to determine the result stored in said device.

25. The device of claim 19, wherein the electrical current is a read current that flows between a first bias terminal coupled to a third edge of the conductive film layer, and a second bias terminal coupled to a fourth edge of the conductive film layer, opposite to the third edge.

26. The device of claim 23, wherein the ferromagnetic layer has an easy magnetization axis that is substantially parallel to the electrical current and substantially perpendicular to the axis joining the first and second sensors.

27. The device of claim 19, wherein the logic device implements the predetermined logical function of one of the following: an OR gate, a NOR gate, a NOT gate, a NAND gate, or an AND gate, and wherein the predetermined logical function is based on an initial configuration of the magnetization orientation, and the amplitude of the current associated with each of the data input signals.

28. The device of claim 20, further including a plurality of said devices coupled together in an array to form a logic gate array, and wherein the input signals are output signals from one or more of said plurality of devices.

29. The device of claim 28, further including a readout circuit for reading out results of logic functions stored in the logic gate array in a predetermined sequence.

30. The device of claim 27, further including a level shifter circuit for converting the output of the logic device to an acceptable voltage logic level usable by a later stage semiconductor circuit.

31. A method of generating an electrical signal, said signal being related to a voltage potential developed along a first axis joining a first point coupled to a first edge of a conductive layer and a second point coupled to a second edge of the conductive layer, said method comprising the steps of:

generating an electrical current that flows along a second axis of a conductive film layer, the second axis being substantially perpendicular to the first axis;

generating a fringe magnetic field along an edge of a ferromagnetic layer located substantially along said first axis, such that the fringe field is coupled substantially normal to the second axis; and wherein the electrical signal is generated in response to the fringe magnetic field acting on the electrical current.

32. The method of claim 31, wherein the fringe magnetic field is derived from an magnetization orientation state of the ferromagnetic layer, and wherein the magnetization state can be changed by inductively coupling the ferromagnetic layer with a write line generating a magnetic field.

33. The method of claim 32, wherein the magnetic field from the write line can set the magnetization orientation to one of a first stable, non-volatile state representing a first value of a binary data item, and a second stable, non-volatile state representing a second value of a binary data item; and wherein the generated electrical signal also has two different values corresponding to the two values of the binary data item.

34. The method of claim 32, wherein the magnetic field from the write line can set the magnetization orientation to one of of two stable non-volatile states, and these states represent a boolean function result relating one or more input logic signals, and wherein the magnetization orientation stores the boolean function result and only changes in response to certain predetermined combinations of the input logic signals.

35. The method of claim 34, further including a step of reading the boolean function binary data stored in the device by measuring the electrical signal and comparing it with a reference value to determine the boolean function result stored in said device.

36. The method of claim 35, further including a step of converting the electrical signal to an acceptable voltage logic level usable by a later stage semiconductor circuit.

37. The method of claim 31, wherein the ferromagnetic layer is coupled to a magnetic field generated by magnetically recorded data and the electrical signal generated is related to a value of the data.

38. An electronic device comprising:

a field effect transistor (FET), including a source region, a drain region, a gate and a channel;

a ferromagnetic layer having a configurable magnetization orientation, and positioned relative to the gate and channel such that a fringe magnetic field directed substantially normal to the channel can be generated by an edge portion of the ferromagnetic layer; and wherein an electrical signal related to the magnetization orientation of the ferromagnetic layer can be generated in response to the fringe magnetic field acting on an electrical current flowing between the source and drain of the FET.

39. The device of claim 38, further including a first sensor coupled to a first end of the channel, and a second sensor coupled to a second end of the channel, opposite to the first edge, such that the electrical signal is a voltage generated substantially along an axis joining the first and second sensors.

40. The device of claim 38, wherein the electrical current flows between a first bias terminal coupled to the source of the FET and a second bias terminal coupled to the drain of the FET.

41. The device of claim 38, further including a write line for configuring the magnetization orientation in the ferromagnetic layer.

42. The device of claim 38, wherein the channel and the ferromagnetic layer are separated by a first insulating layer, and the write line and gate are separated by a second insulating layer.

43. The device of claim 38, wherein the gate controls the electrical current flowing between the source and drain in response to a control signal.

44. The device of claim 38, wherein the ferromagnetic layer is coupled to a magnetic field generated by magnetically recorded data, the electrical signal generated is related to a value of the data, and the device operates as a magnetic field sensor.

45. The device of claim 39, wherein the ferromagnetic layer has an easy magnetization axis that is substantially parallel to the electrical current and substantially perpendicular to the axis joining the first and second sensors.

46. A memory device comprising:

a field effect transistor (FET), including a source, a drain, a gate and a channel;

a ferromagnetic layer having at least two configurable and stable magnetization orientation states corresponding to two different values of a data item stored in said device, and positioned relative to the gate and channel such that a fringe magnetic field directed substantially normal to the channel can be generated by an edge portion of the ferromagnetic layer; and wherein two different output electrical signals corresponding to the two different data values can be generated in response to the fringe magnetization field acting on an electrical current flowing in the channel.

47. The device of claim 46, further including a first sensor coupled to a first end of the channel, and a second sensor coupled to a second end of the channel, such that the two different electrical signals are voltages generated substantially along an axis joining the first and second sensors.

48. The device of claim 46, wherein the two electrical signals comprise a first voltage output signal when a first value of the data item is stored in said device, and a second voltage output value when a second value of the data item is stored in said device.

49. The device of claim 46 further including a sense circuit for comparing the two electrical signals of the device with a reference value to determine the value of the data item stored in said device.

50. The device of claim 46, wherein the electrical current is a read current that flows between a first bias terminal coupled to the source of the FET, and a second bias terminal coupled to a drain of the FET.

51. The device of claim 46, further including a write line for configuring the two configurable magnetization orientation states in the ferromagnetic layer.

52. The device of claim 51, wherein the channel and the ferromagnetic layer are separated by a first insulating layer, and the write line and gate are separated by a second insulating layer.

53. The device of claim 46, wherein the ferromagnetic layer has an easy magnetization axis that is substantially parallel to the electrical current and substantially perpendicular to the axis joining the first and second sensors.

54. The device of claim 46, wherein the magnetization orientation of the ferromagnetic layer:

(I) can be set to a first state in response to a first amplitude write current and associated first write magnetic field; and (ii) can be set to a second state in response to a second amplitude write current and associated second write magnetic field.

55. The device of claim 46, wherein the ferromagnetic layer magnetization orientation is retained in said state until a different state is set in said layer.

56. The device of claim 46, further including a plurality of said memory devices coupled together to form a memory array.

57. The device of claim 46, wherein the gate controls the electrical current flowing between the source and drain in response to a read signal.

58. A logic device for implementing a logic function relating a combination of one or more input signals to an output signal comprising:

a field effect transistor (FET), including a source, a drain, a gate and a channel;

a ferromagnetic layer having at least two configurable and stable magnetization orientation states corresponding to two different results of said logic function and positioned relative to the gate and channel such that a fringe magnetic field directed substantially normal to the channel can be generated by an edge portion of the ferromagnetic layer; and a wire for inductively coupling the ferromagnetic layer with a magnetic field generated by said input data signals on the wire, the input data signals having at least a first or second current value, and wherein two different output electrical signals corresponding to the two different results can be generated in response to the fringe magnetization field acting on an electrical current flowing in the channel.

59. The device of claim 58, wherein the electrical output signal has a first value when the ferromagnetic layer magnetization orientation state is altered by magnetic fields corresponding to a first combination of said input data signals related to said logic function, and the electrical ouput signal has a second value when the ferromagnetic layer magnetization state is not altered by magnetic fields corresponding to a second combination of said input data signals.

60. The device of claim 58, wherein the result of said logic function is stored in said device until the magnetization orientation state is altered by a subsequent combination of input signals.

61. The device of claim 58, wherein the magnetization state of the ferromagnetic layer can be set initially based on the logical function to be implemented by said device.

62. The device of claim 58, further including a first sensor coupled to a first end of the channel, and a second sensor coupled to a second end of the channel, opposite to the first channel, such that the electrical signal is a voltage generated substantially along an axis joining the first and second sensors.

63. The device of claim 60 further including a sense circuit for comparing the electrical output signal of the device with a reference value to determine the result stored in said device.

64. The device of claim 58, wherein the electrical current is a read current that flows between a first bias terminal coupled to the source of the FET, and a second bias terminal coupled to the drain of the FET.

65. The device of claim 58, wherein the ferromagnetic layer has an easy magnetization axis that is substantially parallel to the electrical current and substantially perpendicular to the axis joining the first and second sensors.

66. The device of claim 58, wherein the logic device implements the predetermined logical function of one of the following: an OR gate, a NOR gate, a NOT gate, a NAND gate, or an AND gate, and wherein the predetermined logical function is based on an initial configuration of the magnetization orientation, and an amplitude of a current associated with each of the data input signals.

67. The device of claim 58, further including a plurality of said devices coupled together in an array to form a logic gate array, and wherein the input signals are output signals from one or more of said additional devices.

68. The device of claim 67, further including a readout circuit for reading out results of logic functions stored in the logic gate array in a predetermined sequence.

69. The device of claim 58, further including a level shifter circuit for converting the output of the logic device to an acceptable voltage logic level usable by a later stage semiconductor circuit.

70. A method of generating an electrical signal, said signal being related to a voltage potential developed along a first axis joining a first point coupled to a first edge of a FET channel and a second point coupled to a second edge of the FET channel, said method comprising the steps of:

generating an electrical current that flows from a source of said FET through said channel to a drain of said FET along a second axis that is substantially perpendicular to the first axis;

generating a fringe magnetic field along an edge of a ferromagnetic layer positioned relative to the gate and channel such that the fringe magnetic field is directed substantially normal to the channel; and wherein the electrical signal is generated in response to the fringe magnetic field acting on the electrical current.

71. The method of claim 70, wherein the fringe magnetic field is derived from an magnetization orientation state of the ferromagnetic layer, and wherein the magnetization state can be changed by inductively coupling the ferromagnetic layer with a write line generating a magnetic field.

72. The method of claim 71, wherein the magnetic field from the write line can set the magnetization orientation to one of a first stable, non-volatile state representing a first value of a binary data item, and a second stable, non-volatile state representing a second value of a binary data item; and wherein the generated electrical signal also has two different values corresponding to the two values of the binary data item.

73. The method of claim 70, wherein the magnetic field from the write line can set the magnetization orientation to either of two stable non-volatile states, and these states represent a boolean function result relating one or more input logic signals, and wherein the magnetization orientation stores the boolean function result and only changes in response to certain predetermined combinations of the input logic signals.

74. The method of claim 73, further including a step of reading the boolean function binary data stored in the device by measuring the electrical signal and comparing it with a reference value to determine the boolean function result stored in said device.

75. The device of claim 74, further including a step of converting the electrical signal to an acceptable voltage logic level usable by a later stage semiconductor circuit.

* * * * *